US008873302B2

(12) United States Patent
Fisch et al.

(10) Patent No.: US 8,873,302 B2
(45) Date of Patent: Oct. 28, 2014

(54) COMMON DOPED REGION WITH SEPARATE GATE CONTROL FOR A LOGIC COMPATIBLE NON-VOLATILE MEMORY CELL

(75) Inventors: David Edward Fisch, Pleasanton, CA (US); William C. Plants, Campbell, CA (US); Michael Curtis Parris, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 257 days.

(21) Appl. No.: 13/284,795

(22) Filed: Oct. 28, 2011

(65) Prior Publication Data

US 2013/0107635 A1 May 2, 2013

(51) Int. Cl.
G11C 11/34 (2006.01)
G11C 16/00 (2006.01)
G11C 16/04 (2006.01)
H01L 29/423 (2006.01)
H01L 27/115 (2006.01)
H01L 29/788 (2006.01)

(52) U.S. Cl.
CPC .......... H01L 29/42324 (2013.01); G11C 16/00 (2013.01); G11C 16/0416 (2013.01); H01L 27/11558 (2013.01); H01L 29/7881 (2013.01)
USPC .................. 365/185.33; 365/185.29; 257/321

(58) Field of Classification Search
CPC ........... G11C 16/0433; G11C 16/0425; G11C 16/0416
USPC .......................... 365/185.33, 185.29; 257/321
See application file for complete search history.

(56) References Cited

U.S. PATENT DOCUMENTS

| 5,501,996 | A | 3/1996 | Yang et al. |
| 5,646,430 | A * | 7/1997 | Kaya et al. ................ 257/322 |
| 7,274,060 | B2 | 9/2007 | Popp et al. |
| 7,508,027 | B2 | 3/2009 | Oberhuber et al. |

(Continued)

FOREIGN PATENT DOCUMENTS

| EP | 1432039 A2 | 6/2004 |
| EP | 2346078 A1 | 7/2011 |
| WO | 2009086433 | 7/2009 |

OTHER PUBLICATIONS

PCT Application No. PCT/US2012/000527 Filed Oct. 29, 2012; International Search Report Issued Apr. 24, 2013.

(Continued)

*Primary Examiner* — Son Dinh
*Assistant Examiner* — Nam Nguyen

(57) ABSTRACT

An array of memory cells, in which one or more memory cells have a common doped region. Each memory cell includes a transistor with a floating gate, source and drain regions, and separate gate and drain voltage controls. Each memory cell also includes a coupling capacitor electrically coupled to and located laterally from the floating gate. In the array, first bit lines are oriented in a first direction, wherein a first bit line is coupled to drain regions of transistors that are arranged in a column. The array includes second bit lines also oriented in the first direction, wherein a second bit line is coupled to source regions of transistors that are arranged in a column. The array also includes word lines oriented in a second direction, wherein each word line is coupled to control gates of coupling capacitors that are arranged in a row.

31 Claims, 18 Drawing Sheets

(56) References Cited

U.S. PATENT DOCUMENTS

| | | |
|---|---|---|
| 7,920,426 B2 | 4/2011 | Liu |
| 2004/0056299 A1 | 3/2004 | Ding et al. |
| 2004/0109364 A1 | 6/2004 | Yang et al. |
| 2004/0248371 A1 | 12/2004 | Wang |
| 2007/0158699 A1 | 7/2007 | Watanabe et al. |
| 2008/0186772 A1 | 8/2008 | Horch |
| 2009/0122605 A1 | 5/2009 | Liu et al. |
| 2010/0078702 A1 | 4/2010 | Nakao |
| 2010/0155805 A1 | 6/2010 | Ozawa |
| 2010/0165698 A1 | 7/2010 | Liu |
| 2011/0101440 A1 | 5/2011 | Cai et al. |

OTHER PUBLICATIONS

PCT Application No. PCT/US2012/000527 Filed Oct. 29, 2012; Written Opinion of the International Searching Authority Issued Apr. 24, 2013.

\* cited by examiner

COMMON DOPED REGION WITH SEPARATE GATE CONTROL FOR A LOGIC COMPATIBLE NON-VOLATILE MEMORY CELL

RELATED APPLICATIONS

The present application is related to U.S. patent application Ser. No. 13/284,783, filed on Oct. 28, 2011, entitled "NON-VOLATILE MEMORY DEVICES HAVING VERTICAL DRAIN TO GATE CAPACITIVE COUPLING," naming David E. Fisch and Michael C. Parris as inventors. That application is incorporated herein by reference in its entirety and for all purposes.

BACKGROUND

One time programmable (OTP) and multi-time programmable (MTP) memories have been recently introduced for beneficial use in a number of applications where customization is required for both digital and analog designs. These applications include data encryption, reference trimming, manufacturing identification (ID), security ID, and many other applications. Incorporating OTP and MTP memories nonetheless typically comes at the expense of some additional processing steps.

For example, OTP and MTP memories may include flash memory devices that store data on an array of programmable memory cells. Typically, these cells are made from floating-gate metal oxide semiconductor field effect transistors (MOSFETs) that can be electrically erased and reprogrammed. The floating gate FET includes a source region, a drain region, and a channel electrically coupling the two regions. A double polysilicon gate structure is disposed normally over the channel, and includes a control gate, and a floating gate disposed under the control gate and isolated by oxide layers, such that the floating gate is electrically isolated from the channel and the control gate. Because the floating gate is electrically isolated, any electrons placed in this layer are trapped, and will remain trapped under normal conditions for many years. The control gate is capacitively coupled to the floating gate. Programming, erasing, and reading the MOSFET is achieved by applying various voltages between the control gate, source region, and drain region in different combinations.

Numerous steps are implemented to fabricate one or more MOSFETs on a silicon wafer. These include various deposition, removal, patterning, and masking steps to grow the features of the MOSFET, including the drain and source regions, the floating gate oxide layer, and the control gate oxide layer. For a typical flash memory cell having a double polysilicon gate structure, it may take up to 20 or more masking steps. Each subsequent masking step will increase the fabrication cost and also degrade the quality of the transistors. As such, for embedded applications, the use of flash memory fabricated onto portions of the silicon chip may be too costly for the function provided, and may affect the quality of all the active transistors on the chip.

It is desirous to achieve a floating gate memory device without a double polysilicon gate structure.

SUMMARY

Embodiments of the present invention provide for single gate, non-volatile floating gate memory devices that are programmable through separate gate and drain voltage controls. For instance, methods and apparatus are described for memory arrays including memory transistors having a common doped region having n-type or p-type dopants (e.g., n-doped region, such as, an actively doped N+ region or n-well) and separate gate and drain controls.

A memory array of a first configuration (e.g., Array #1 of FIGS. 5A-F) is described and includes a plurality of memory cells arranged in an array of rows and columns. Each memory cell includes separate gate and drain voltage controls. Further, each memory cell includes a memory transistor including a floating gate, and source and drain regions. The memory cell also includes a coupling capacitor acting as a control gate electrically coupled to and located laterally from the floating gate. In the array, a plurality of first bit lines is oriented in a first direction, wherein each first bit line is coupled to drain regions of floating gate memory transistors that are arranged in a corresponding column. The array includes a plurality of second bit lines oriented in the first direction, wherein each second bit line is coupled to source regions of floating gate memory transistors that are arranged in a corresponding column. The array also includes a plurality of word lines oriented in a second direction that is orthogonal to the first direction, wherein each word line is coupled to control gates of coupling capacitors that are arranged in a corresponding row.

In another embodiment, a method for operating a memory array of a first configuration is disclosed. The method includes providing a plurality of memory cells arranged in an array of rows and columns. Each of the memory cells includes a floating gate memory transistor and a coupling capacitor. The transistor includes a floating gate, a source region, and a drain region. The memory cell also includes a coupling capacitor with the well terminal acting as a control gate to the memory transistor, wherein the capacitor is electrically coupled to the floating gate and located laterally from the floating gate memory transistor. In the method, a plurality of first bit lines is provided. The first bit lines are oriented in a first direction. Also, each first bit line is coupled to drain regions of floating gate memory transistors that are arranged in a corresponding column. A plurality of second bit lines is also provided. The second bit lines are oriented in the first direction. Also, each second bit line is coupled to source regions of floating gate memory transistors that are arranged in a corresponding column. A plurality of word lines is also provided. The word lines are oriented in a second direction that is orthogonal to the first direction. Each word line is capacitively coupled to control gates of coupling capacitors that are arranged in a corresponding row of memory transistors. For operational use of the array, various combinations of voltages are applied to one or more first bit lines, one or more second bit lines, and one or more word lines to program, erase, and read one or more floating gate memory transistors in the plurality of memory cells.

A memory array of a second configuration (e.g., Array #2 in FIGS. 7A-E) is described in another embodiment and includes a plurality of memory cells arranged in an array of rows and columns, in one embodiment. Each memory cell includes separate gate and drain voltage controls. Further, each memory cell includes a memory transistor including a floating gate, and source and drain regions. The memory cell also includes a coupling capacitor with a well terminal acting as a control gate electrically coupled to and located laterally from the floating gate. In the array, a plurality of first bit lines is oriented in a first direction, wherein each first bit line is coupled to drain regions of floating gate memory transistors that are arranged in a corresponding row. The array includes a plurality of second bit lines oriented in a second direction that is orthogonal to the first direction. Each second bit line is coupled to source regions of floating gate memory transistors that are arranged in a corresponding column. The array also includes a plurality of word lines oriented in the first direction, wherein each word line is capacitively coupled to control gates of coupling capacitors that are arranged in a corresponding row.

In still another embodiment, a method for operating a memory array of the second configuration is disclosed. The method includes providing a plurality of memory cells arranged in an array of rows and columns. Each of the memory cells includes a floating gate memory transistor and a coupling capacitor. The transistor includes a floating gate, a source region, and a drain region. The transistor also includes a coupling capacitor with the well terminal acting as a control gate to the memory transistor, wherein the capacitor is electrically coupled to the floating gate and located laterally from the floating gate memory transistor. In the method, a plurality of first bit lines is provided. The first bit lines are oriented in a first direction. Also, each first bit line is coupled to drain regions of floating gate memory transistors that are arranged in a corresponding row. A plurality of second bit lines is also provided. The second bit lines are oriented in a second direction that is orthogonal to the first direction. Also, each second bit line is coupled to source regions of floating gate memory transistors that are arranged in a corresponding column. A plurality of word lines is also provided. The word lines are oriented in the first direction. Each word line is coupled to control gates of coupling capacitors that are arranged in a corresponding row of memory transistors. For operational use of the array, various combinations of voltages are applied to one or more first bit lines, one or more second bit lines, and one or more word lines to program, erase, and read one or more floating gate memory transistors in the plurality of memory cells.

These and other objects and advantages of the various embodiments of the present disclosure will be recognized by those of ordinary skill in the art after reading the following detailed description of the embodiments that are illustrated in the various drawing figures.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of the disclosure.

DETAILED DESCRIPTION

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Accordingly, embodiments of the present disclosure illustrate single gate, non-volatile floating gate memory devices that are programmable through separate conductors for the source and drain nodes of a non-volatile memory cell, as well as the doped region contact capacitively coupled to a floating gate. Further, in other embodiments, one or more non-volatile memory cells are able to share a corresponding doped region, thereby improving layout efficiency and density by minimizing the overhead associated with well to well spacing and well to N+ gate spacing. Embodiments of the present invention provide the above advantages and further provides for process simplicity through the lateral location of the doped region coupled to the floating gate. Still other embodiments provide the above advantages and further provides for faster read operations, as well as improved programming and read control at low voltages, and increased decoding options over two-terminal non-volatile memory devices.

Figure 1:
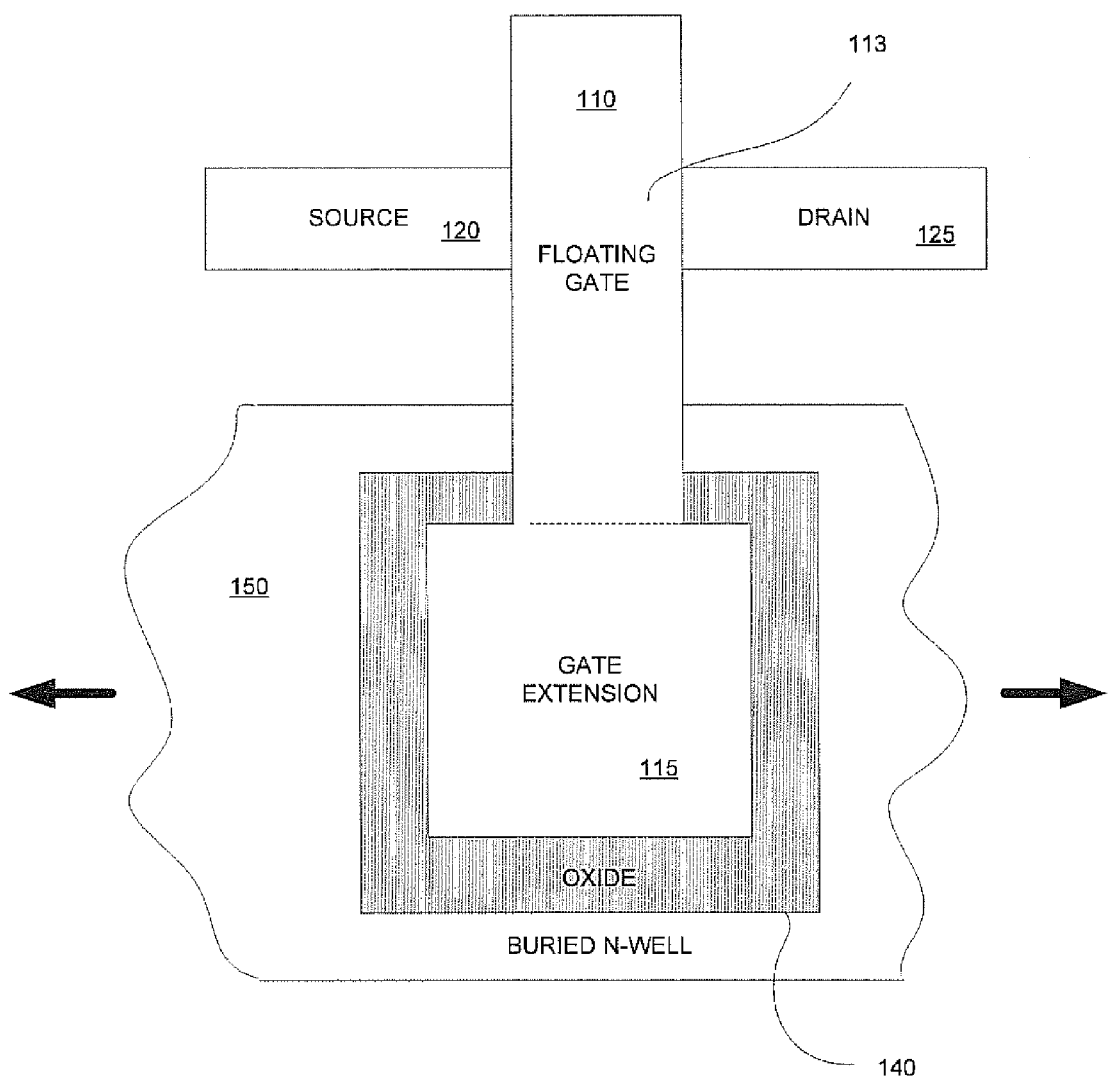
FIG. 1 is a top view of a memory transistor including source and drain regions, a floating gate capacitively coupled to a common doped region located laterally from the memory transistor, in accordance with one embodiment of the present disclosure.

FIG. 1 is a top view of a non-volatile memory cell 100 including a typical complementary metal oxide semiconductor field effect transistor (CMOS) including a source region 120, a drain region 125, and a floating gate 110. In embodiments, the memory transistor is formed using conventional transistor metal oxide semiconductor techniques with appropriate modifications. As such, features shown in the memory transistor (e.g., source region, drain region, gate, etc.) comprise materials known to be suitable for use in the fabrication of CMOS memory devices.

The material forming the floating gate 110 is single polysilicon layer, in one implementation, but can be any suitable material capable of storing charge. For instance, the floating gate may be comprised of a metal layer, a polysilicon layer, or any other suitably conducting material. In addition, the floating gate 110 is not electrically connected to a voltage source, but a voltage is applied to the gate 110 through capacitive coupling. More particularly, the floating gate 110 is capacitively coupled to a doped region 150, doped with n-type or p-type dopants (e.g., an n-doped region, such as an actively doped N+ region or n-well), at least portions of which are located laterally from the memory transistor. The channel region 113 of memory transistor is disposed between the source region 120 and drain region 125, and under portions of the floating gate 110.

The floating gate 110 extends beyond the channel region 113 of the memory transistor in cell 100. For instance, the floating gate 110 includes and/or is electrically coupled to a gate extension 115 that is disposed laterally from the channel region 113 of the memory transistor. More particularly, the gate extension 115 overlaps a buried doped region 150, wherein an oxide layer 140 is disposed between the gate contract 115 and the buried doped region 150. In that manner, the gate extension 115 and by association the floating gate 110 are capacitively coupled to the doped region 150. As such, any voltage applied to the doped region 150 is applied through capacitive coupling to the floating gate 110.

As shown in FIG. 1, the buried doped region 150 is capacitively coupled to one or more memory transistors throughout an array of memory cells. For instance, doped region 150 is continuous in a first direction of the array. As such, the buried doped region is common to or sharable with other similarly configured non-volatile memory cells 100. For instance, one or more similarly configured non-volatile memory cells 100 are coupled to the doped region 150. In one implementation, the memory cells 100 that share the common doped region 150 are configured in a column or row of an array of memory cells. In another implementation, the memory cells 100 that share the common doped region are configured in two or more columns or rows of an array of memory cells. The sharing of doped regions by one or more memory cells 100 improves layout efficiency and density of an array of memory cells by minimizing the overhead associated with well to well spacing and well to N+ spacing, for example.

Control of the memory transistor is achieved by applying various voltages effectively to the source region 120, the drain region 125, and the doped region 150 in various combinations. For instance, current flow is manipulated in the channel region 113 for purposes of injecting electrons into the floating gate 110, removing electrons from the floating gate 110, or for purposes of performing a read operation on the semiconductor memory transistor in cell 100, as influenced by the charge on the floating gate 110. It is understood by those skilled in the art that the voltages will vary from application to application, and can be configured based on desired memory transistor operating characteristics.

Operation of the transistor in the non-volatile memory cell 100 is similar to that of conventional input/output (I/O) transistors implemented in an advanced complementary metal-oxide semiconductor (CMOS) logic process, in one embodiment. For example, the memory cell 100 may be rated at a low voltage, such as 3.3 V, but is understood that this value may vary as a function of the physical dimensions of the I/O transistors. During operation, the transistor in the non-volatile memory cell 100 may have a threshold voltage of approximately 0.5 V to 0.7 V. The memory cell 100 is originally in an unprogrammed state. As an example, to perform a read operation on the memory cell to determine its state, a voltage of 1.0 V may be applied to the drain, and 1.0 V may be realized at the floating gate by applying a higher voltage to the doped region coupled to the floating gate. Since the floating gate is capacitively coupled to the common doped region, depending on the coupling ratio, a voltage of approximately 1 V or greater may be applied to the common gate. When reading a programmed memory cell 100, current does not flow, which indicates a logic-0. On the other hand, when reading an erased cell 100, current will flow, which indicates a logic-1. As a further example, to program the non-volatile memory cell 100 into a programmed state, a drain voltage of approximately 5.0 V may be applied to the drain, while the source and the substrate are held at ground. It is important to drive the floating gate high in order to obtain hot electron injection, such as applying a capacitively coupled voltage of greater than 5 V to the floating gate. Depending on the coupling capacity, a voltage of 10 V or greater may be applied to the common control gate region, without a deterioration in performance or size penalties in generating the voltages since there is only a small load on the supply. In still another example, to erase the non-volatile memory cell 100 through the removal of electrons in the floating gate, a voltage of approximately 6 V may be applied to the source, while the drain and gate coupling node may be left floating, and the substrate may be held at ground.

Figure 2:
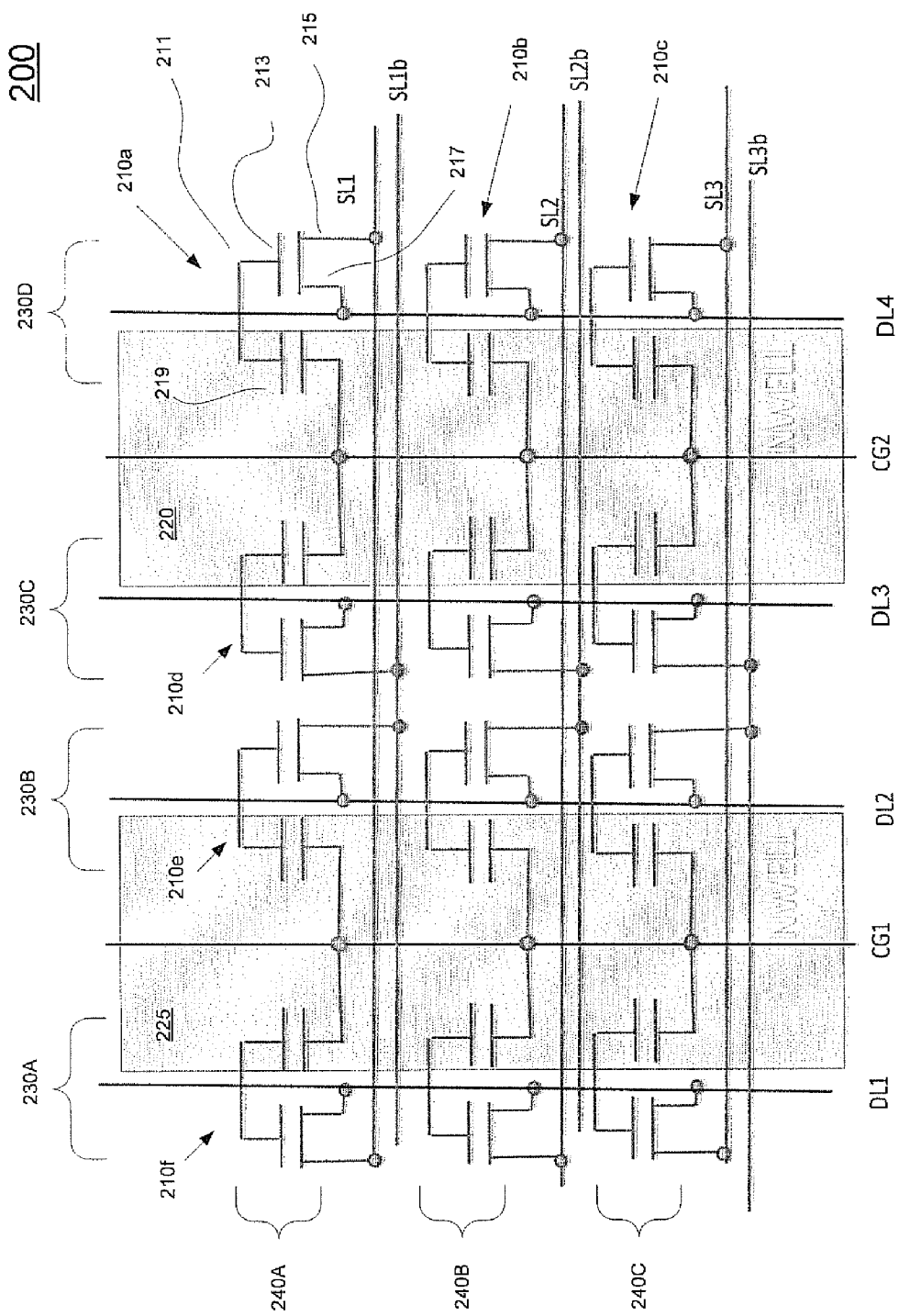
FIG. 2 is a layout of an array of planar floating gate field effect transistors (FETs) including shared doped regions between pairs of rows of memory transistors, and wherein each memory cell includes separate gate and drain voltage controls, in accordance with one embodiment of the present disclosure.

FIG. 2 is a exemplary layout of an array 200 of planar floating gate memory cells (e.g., MOSFETs) including doped regions common between one or more non-volatile memory cells, such as, those configured in one or more columns or rows of an array, and wherein each memory cell includes separate gate and drain voltage controls, in accordance with one embodiment of the present disclosure. In one embodiment, the memory cells in array 200 comprise memory cell 100 of FIG. 1. Array 200 is representative of the use of a common doped (e.g., n-doped or p-doped) region shared by non-volatile memory cells configured in one or more columns or rows of array 200.

As shown in FIG. 2, the array 200 includes a plurality of non-volatile memory cells arranged in an array of rows and columns. For instance, the array 200 includes rows 230A-D, and columns 240A-C. It is understood that the array 200 shown in FIG. 2 is representative and may include arbitrary numbers of rows and columns of memory cells. For purposes of the present Application, rows are oriented up and down the page and memory array 200 as presented in FIG. 2, while columns are oriented right and left across the page and memory array.

Memory cell 210a is representative of the memory cells in array 200, and includes a non-volatile transistor and a coupling capacitor. The non-volatile transistor 211 includes a floating gate 213, a source region 215, and a drain region 217. The common gate single CG2 is capacitively coupled to the floating gate 213 through coupling capacitor 219. In one embodiment, the capacitor 219 is located laterally from the non-volatile memory transistor 211. A portion of any voltage applied to common gate signal CG2 is applied to the floating gate 213 by means of capacitive coupling through capacitor 219. For instance, the coupling capacitor 219 may be configurable between a doped region 220 including n-type or p-type dopants (e.g., an n-doped region, such as an actively doped N+ region or n-well) and the floating gate 213 of the memory transistor 211. As such, a portion of any voltage applied to the doped region 220 is applied to the floating gate 213 through capacitive coupling.

In the array 200, a plurality of drain lines is configured in a first direction as defined by the array. As shown in FIG. 2, drain lines DL1, DL2, DL3, and DL4 are shown oriented in the first direction. It is understood that array 200 may include less than or more than four drain lines. Moreover, each drain line is associated with a corresponding row of memory devices. As an example, drain line DL4 is coupled to drain regions of memory transistors of memory cells that are configured in a row. For instance, memory cells 210a, 210b, and 210c are configured in a row, and share common doped region 220.

In addition, a plurality of source lines is configured in a second direction. As shown, source lines SL1, SL1b, SL2, SL2b, SL3, and SL3b are shown oriented in the second direction. It is understood that array 200 may include one or more source lines, wherein each source line is associated with a corresponding column of memory cells. For instance, source line SL1 is associated with column 240A, and is electrically coupled to source regions of memory transistors 210a and 210f.

In still another embodiment, as shown in FIG. 2, source lines are paired in one embodiment, wherein each pair of source lines is also associated with a corresponding column of memory cells. As an example, one pair of source lines includes SL1 and SL1b that support the memory cells of row 240A. In particular, source line SL1 is electrically coupled to source regions of memory transistors 210a and 210f in row 240A, and source line SL1b is electrically coupled to source regions of memory transistors 210d and 210e in row 240A. Other pairs of source lines include SL2 and SL2b that are electrically coupled to source regions of memory cells of row 240B, and SL3 and SL3b that are electrically coupled to source regions of memory cells of row 240C.

Furthermore, the array 200 includes a plurality of doped regions and a plurality of common gates, all of which are oriented in the same direction, the first direction as shown in FIG. 2. Each doped region is configured to form coupling capacitors in one or more columns or rows of memory cells. As shown in FIG. 2, a doped region is configured to form coupling capacitors for memory cells in two rows. For instance, common well 220 forms coupling capacitors in rows 230C and 230D. A common gate line is coupled to corresponding doped regions. For instance, common gate line CG1 is coupled to doped region 225, and is used to apply a voltage to the common doped region 225, that is capacitively coupled to corresponding floating gates in memory cells of rows 230A and 230B. Also, common gate line CG2 is coupled to doped region 220, and is used to apply a voltage to the common doped region 220, which is capacitively coupled to corresponding floating gates in memory cells of rows 230C and 230D.

The layout of array 200 in FIG. 2 is representative of the use of a common doped region shared by non-volatile memory cells configured in one or more columns and one or more rows of memory cells. By applying appropriate voltages to various combinations of source, drain, and word lines, one or more memory cells in the array can be programmed, erased, and/or read. Also, various layouts of memory cells are possible, each of which include a common doped region shared by non-volatile memory cells for purposes of layout efficiency. In addition to the representative layout of array 200, additional layouts or configurations of non-volatile memory cells include Arrays #1 and #2 of FIGS. 5A-F and 7A-E. Still other configurations are possible and contemplated in embodiments of the present invention.

Figure 3:
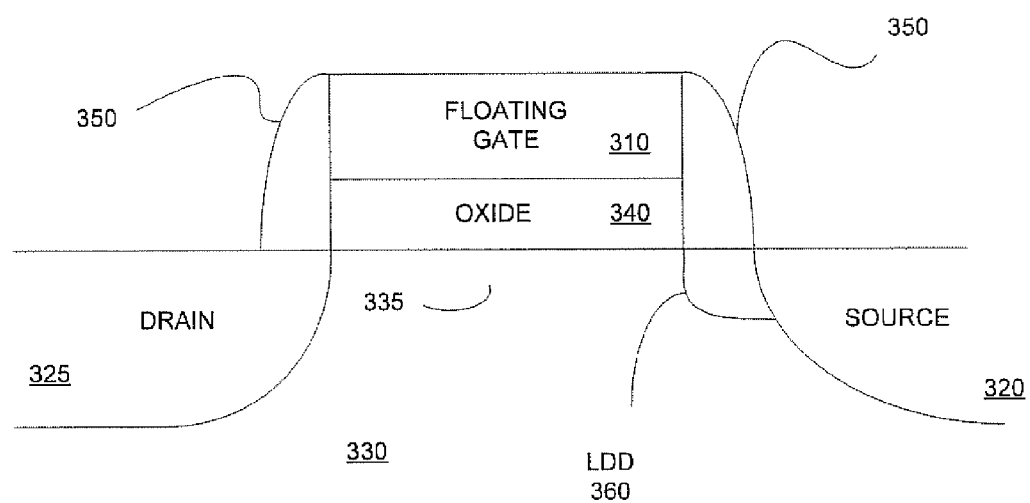
FIG. 3 is a cross-sectional view of a planar floating gate transistor illustrating the asymmetric characteristics of the source and drain regions for facilitating source side injection of electrons, in accordance with one embodiment of the present disclosure.

FIG. 3 is a cross-sectional view of an exemplary planar floating gate memory transistor 300 illustrating the asymmetric characteristics of the source and drain regions for facilitating source side injection of electrons, in accordance with one embodiment of the present disclosure. For instance, memory transistor 300 is representative of the non-volatile memory transistors implemented within array 200, in one embodiment.

Some embodiments of the present disclosure are implemented using memory transistors configured for source side injection for purposes of performing program operations. For instance, the asymmetric configuration of the source and drain regions of memory transistor 300 is configured for hot electron injection into the floating gate from the source side of the channel (sometimes called source side injection). However, other embodiments of the present disclosure are well suited to supporting memory arrays using symmetrically configured memory transistors for hot electron and/or hot hole injection for performing erase and program operations. In one instance, a symmetric configuration of the source and drain regions in a memory transistor facilitates electron injection that is more highly concentrated nearer to the drain region of a memory transistor. Typically either symmetric or asymmetric memory transistors can be created by means of minor process tweaks without adding additional masking steps. This is important for keeping the cost of manufacturing the device as low as possible.

Continuing with the asymmetric configuration shown in FIG. 3, transistor 300 includes a source region 320 and a drain region 325. In one implementation, the source and drain regions are highly doped with $n^+$ dopants in a p-type substrate 330 for an re-channel device. In other implementations, the source and drain regions are doped with $p^+$ dopants in an n-type substrate 330 for a p-channel device. A gate structure is disposed over the channel region 335 between the source region 320 and the drain region 325, and includes a floating gate 310 disposed over an oxide layer 340. Spacer oxides 350 are shown on either side of the gate structure, and are used in part to facilitate deposition of the lightly doped drain (LDD) region 360. For instance, using the example provided above of an n-channel device, the LDD region 360 is lightly doped with $n^-$ dopants. As such, by applying various combinations of voltages and/or signals to the source region 320, drain region 325, and the floating gate 310 of the transistor 300, programming, erasing, and reading operations can be performed.

The LDD region 360 and source region 320 combined form a smoothly graded source junction interface to the channel region 335. On the other hand, the interface of drain 325 to the channel region 335 is sharply graded. The smoothly graded source junction promotes source side injection of electrons at low drain voltages when the transistor is turned on by creating a change in the electron current flux under the floating gate due to the abrupt change of effective resistance due to the relatively high resistivity of the lightly doped drain. For instance, when the source region 320 is coupled to ground, and appropriately large voltages are applied to the floating gate 310 and drain region 325, an intermediate voltage is applied to the channel side of the LDD region 360 due to current flow through the LDD region. This causes the degree of inversion under the floating gate to decrease further increasing the change in the current flux which causes electron scattering near the LDD region 360. Some of these electrons are injected into the floating gate 310 and server to program the memory cell by increasing its threshold voltage.

The graded junction on the source side of transistor 300 promotes source side hot electron injection into the floating gate 310 during a programming operation. Source side hot electron injection is more efficient when compared to typical operations that inject electrons nearer to the drain region 325.

Figure 4:
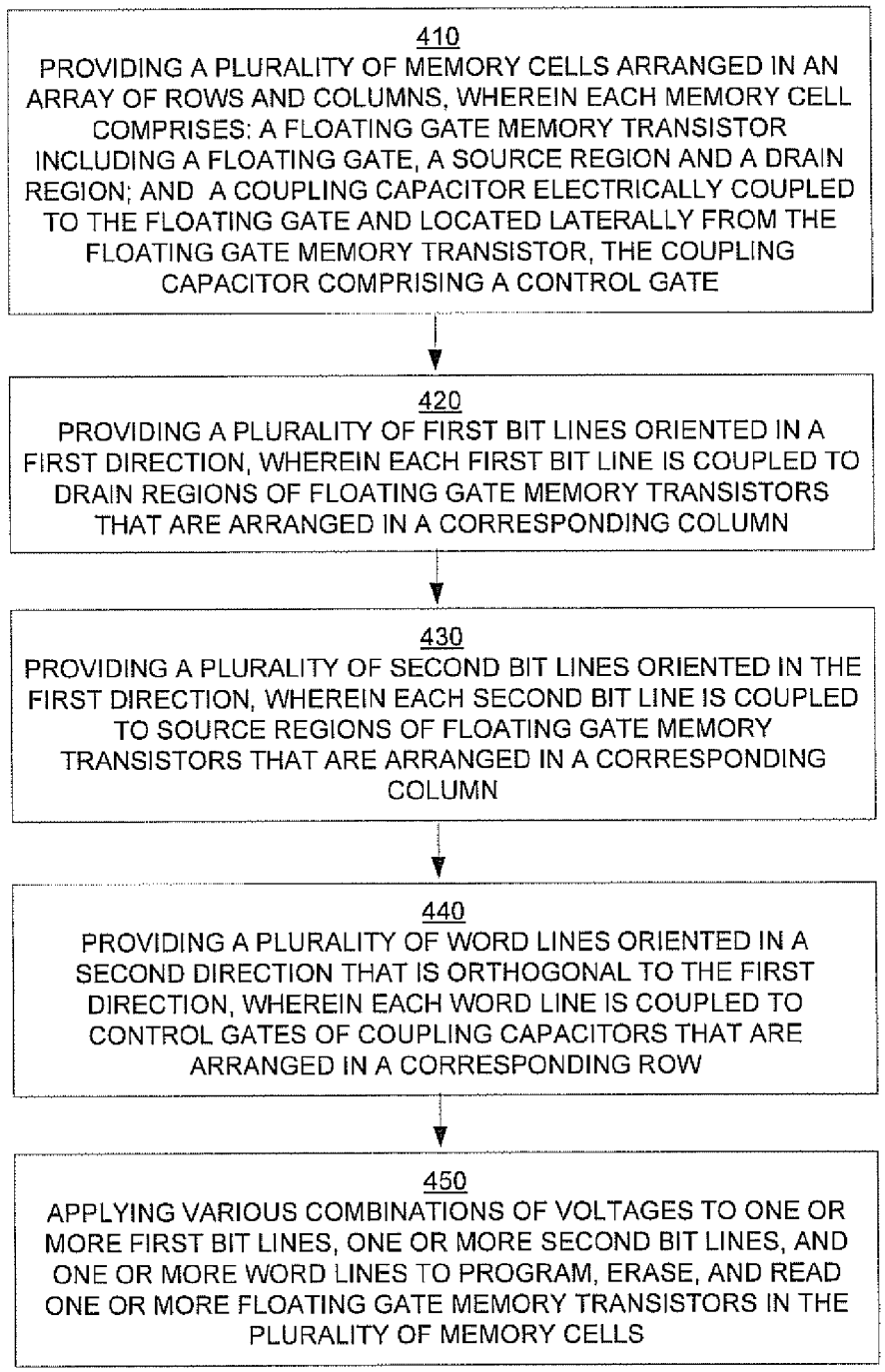
FIG. 4 is a flow chart illustrating a method of forming an array of floating gate FETs including shared doped regions between pairs of columns of memory transistors, and wherein each memory cell includes separate gate and drain voltage controls, in accordance with one embodiment of the present disclosure.

FIGS. 4 and 5A-F combined illustrate a method and devices for operating an array of floating gate MOSFETs. Specifically, FIG. 4 is a flow chart 400 illustrating a method of operating an array of floating gate FETs including shared doped regions having n-type or p-type dopants (e.g., an n-doped region, such as an actively doped N+ region or n-well) capacitively coupled to one or more memory cells, and wherein each memory cell includes separate gate and drain voltage controls, in accordance with one embodiment of the present disclosure. FIGS. 5A-F illustrate a configuration of Array #1 in which a common doped region is capacitively coupled to one or more memory cells, and provide specific operational uses of Array #1. That is, in embodiments, the method outlined in flow chart 400 is implemented within a configuration of memory cells, such as, that disclosed by Array #1 of FIGS. 5A-F.

Turning now to FIG. 4, flow chart 400 illustrates a method for operating an array (e.g., Array #1) including memory cells driven by separate drain and gate voltage sources, in accordance with one embodiment of the present disclosure. The memory cell 100 is implemented within the array outlined in flow chart 400, in one embodiment.

At 410, a plurality of memory cells is provided and arranged in an array of rows and columns. Each of the memory cells includes a floating memory transistor that comprises a floating gate, a source region, and a drain region. The memory cell also includes a coupling capacitor that is capacitively coupled to the floating gate. The coupling capacitor is located laterally from the floating gate memory transistor. In one embodiment, the coupling capacitor comprises a control gate, in that a portion of voltages applied to the capacitor are capacitively coupled to the floating gate, wherein the capacitor comprises a common doped region shared by one or more memory cells.

At 420, a plurality of first bit lines is provided, each of which is oriented in first direction. Moreover, each first bit line is coupled to drain regions of corresponding floating gate memory transistors that are arranged and/or configured in a corresponding column. Memory cells including the corresponding floating gate memory transistors are also arranged and/or configured in a column in the memory array. The first bit lines may be referred to as drain lines.

At 430, a plurality of second bit lines is provided in the memory array. Each second bit line is also oriented in the first direction, such that the first and second bit lines are approximately parallel to each other within the array. Moreover, each second bit line is coupled to source regions of corresponding floating gate memory transistors that are arranged and/or configured in corresponding column. Memory cells including the corresponding floating gate memory transistors are also arranged and/or configured in a column in the memory array. The second bit lines may be referred to as source lines.

At 440, a plurality of word lines is provided in the memory array. Each of the word lines is oriented in a second direction that is approximately orthogonal to the first direction. Each word line is coupled to control gates of the coupling capacitors that are arranged in a corresponding row. That is, a row includes one or more memory cells, wherein a memory cell includes a memory transistor that includes a floating gate that is capacitively coupled to a capacitor acting as a control gate. In one embodiment, the capacitor is formed from a doped region that is common to one or more memory cells, each of which having separate gate, drain, and source voltage controls. In one implementation, the doped region is common to memory cells in the row. In that manner, a voltage placed on the common doped region forming part of the capacitor is also applied in part to the floating gate.

At 450, various combinations of voltages are applied to one or more of the first bit lines, one or more of the second bit lines, and one or more of the word lines to program, erase and read one or more of the floating gate memory transistors in corresponding memory cells in the plurality of memory cells. For instance, combinations of voltages may be applied to erase a row of memory cells, erase a column of memory cells, erase a bit or memory cell, program one or more bits or memory cells in a column of memory cells, and read a bit or memory cell.

FIGS. 5A-F are illustrations of various operations performed on a configuration of memory cells of a first array (Array #1), in which a common doped region including n-type or p-type dopants (e.g., n-doped region, such as an actively doped N+ region or n-well) is capacitively coupled to one or more memory cells. More particularly, operations include row erase, column erase, bit (e.g., memory cell) erase, bit program, and bit read. For purposes of the present Application, rows are oriented up and down the pages and memory arrays as presented in FIGS. 5A-F, while columns are oriented right and left across the pages and memory arrays.

The memory cell configuration or layout of Array #1 is illustrated in each of FIGS. 5A-F, and includes a plurality of memory cells arranged in an array of rows and columns. Each of the memory cells includes a floating gate memory transistor including a floating gate, a source region, and a drain region. Each memory cell also includes a coupling capacitor that is electrically coupled to the floating gate and located laterally from the floating gate transistor. The capacitor is capacitively coupled to the floating gate and acts as a control gate as a voltage applied to the capacitor (e.g., to the doped region) is applied to the floating gate through capacitive coupling. Array #1 also includes a plurality of first bit lines (e.g., DL0, DL1, DL2, DL3, etc.), each of which is oriented in a first direction. Each first bit line is coupled to drain regions of one or more floating gate memory transistors arranged in a corresponding column, wherein a first bit line is also referred to as a drain line. Array #1 also includes a plurality of second bit lines (e.g., SL0,1; SL2,3; etc.), each of which is oriented in the first direction. Each second bit line is coupled to source regions of one or more floating gate memory transistors arranged in a corresponding column, wherein a second bit line is also referred to as a source line. As shown, a source line is shared between a pair of columns of memory cells. For instance, a single source line SL2,3 is shared by memory cells in columns 520 and 525. As such, first (drain) and second (source) bit lines are parallel to each other within the configuration of Array #1. Also, a plurality of word lines is included in Array #1 (WL0, WL1, WL2, WL3, etc.), wherein each word line is oriented in a second direction that is orthogonal to the first direction. Each word line is coupled to coupling capacitors through a corresponding doped region, wherein the capacitors act as control gates to memory transistors configured in a row of Array #1. As shown, the doped region is common to one or more memory transistors and/or memory cells configured in a row. For instance, doped region 515, represented as a diode coupled to the p-type substrate, is coupled to WL2 of a corresponding row of memory cells. While only shown once in each row to avoid overcomplicating the figure, the n-doped region is present in all cells in the corresponding row (e.g., the n-doped region 515 is present in all cells in row 510).

In still another embodiment, a plurality of sense amplifiers and column driver circuits are coupled to the plurality of first and/or second bit lines for facilitating program, read, and erase operations. In other embodiments, instead of sense amplifiers, any means suitable for measuring current or voltage is coupled to the plurality of first and/or second bit lines. The sense amplifier and/or measuring means are used for purposes of measuring current or voltage when performing programming, erase, and read operations on the array.

Figure 5A:
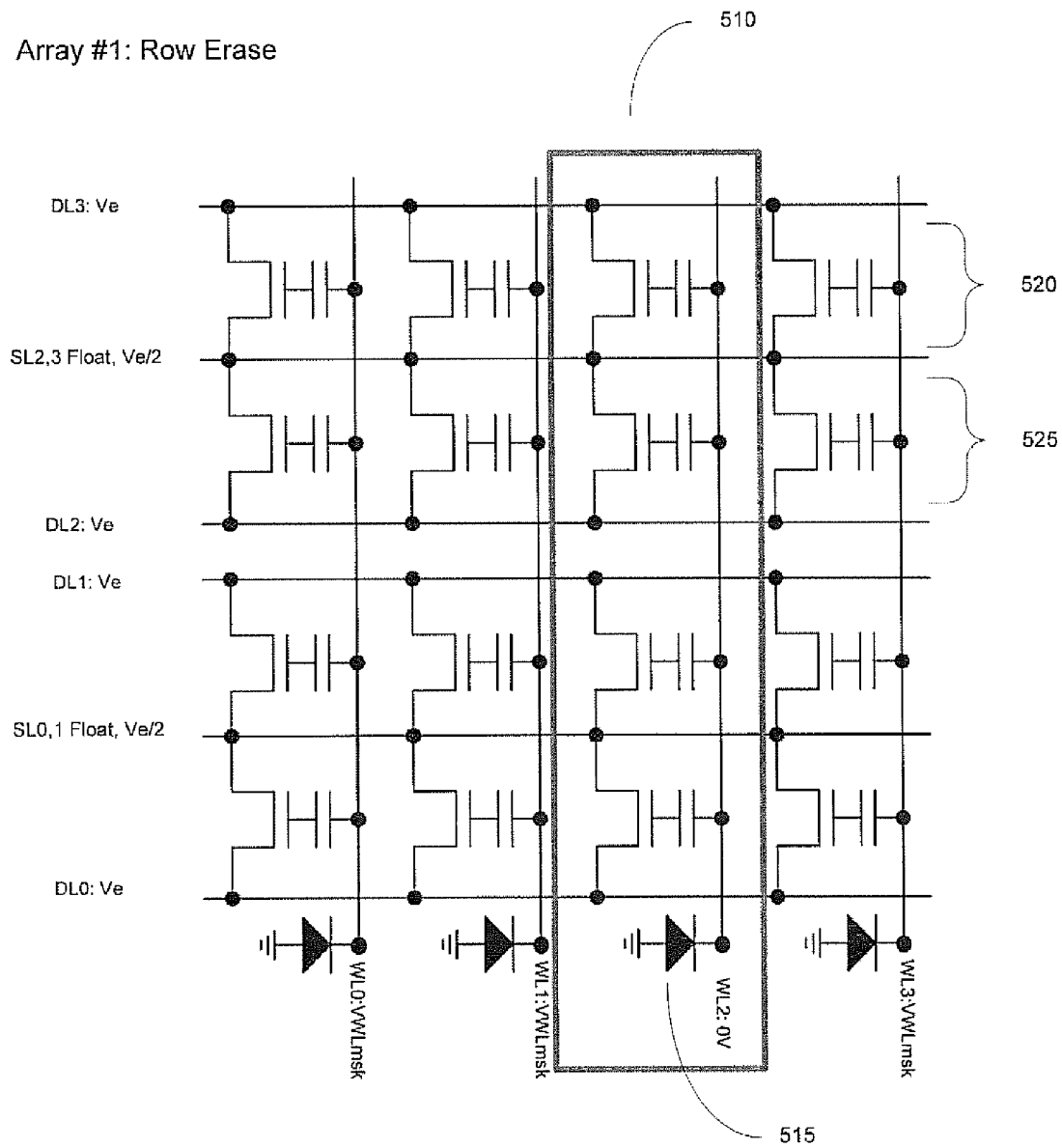
FIG. 5A is an illustration of a row erase operation in a layout of an array of floating gate FETs including shared doped regions and source lines between one or more memory transistors in a column, and wherein each memory cell includes separate gate and drain voltage controls, in accordance with one embodiment of the present disclosure.

FIG. 5A is an illustration of a row erase operation in a layout of Array #1 500, wherein each memory cell includes separate source, drain, and gate voltage controls, in accordance with one embodiment of the present disclosure. As shown in FIG. 5A, a combination of voltages is applied to Array #1 to erase memory cells in row 510. That is, all the memory cells in row 510 are erased, such that electrons are removed from the floating gates of the corresponding memory transistors of the memory cells through hot hole injection. In particular, the erase operation is performed at relatively low voltage (e.g., 6 volts) via hot hole injection (also known as band-to-band tunneling), instead of using Fowler-Nordheim tunneling which typically requires much higher operating voltages (e.g., 12 volts).

Specifically, for row erase 0 V or ground is applied to WL2 corresponding to row 510, which is subsequently applied through capacitive coupling to the floating gates of memory transistors in row 510. A masking voltage VWLmsk is applied to remaining word lines (WL0, WL1, WL 3, etc.) in the array, so that memory transistors not in row 510 are not affected or erased. In one implementation, VWLmsk is approximately one-half the erase voltage (Ve). Also, a high voltage is applied to the plurality of first bit lines, or drain lines. For instance, an erase voltage (Ve) (e.g., approximately 6 V) is applied to the plurality of first bit lines, or drain lines (e.g., DL0-3, etc.). Further, with regards to the plurality of second bit lines (e.g., SL0, 1, 2, 3, etc.), the source lines are left floating in some implementations, or ½ Ve may be applied to the second bit lines in others. The voltage applied to the first bit lines causes the drain terminals of the transistors to be sufficiently reverse biased that avalanche breakdown occurs creating hole-electron pairs near the drain regions. The current on the first bit lines is limited by the first bit line driver circuits so no damage occurs, but sufficient hot holes are created that a significant number tunnel onto the floating gates of the memory cells in the row. The holes then recombine with the electrons on the floating gate resulting in a reduction of the number of electrons trapped on the floating gates, lowering the threshold voltages of the transistors to the erased state.

In still another embodiment, continuing from FIG. 5A, a block of the Array #1 is erasable, wherein the block includes designated first bit lines (drain lines), designated second bit lines (source lines), and designated word lines. To erase the block, an erase voltage Ve is applied to all the designated drain lines, and all the designated word lines are held at ground or 0 V. The source lines are left floating.

Figure 5B:
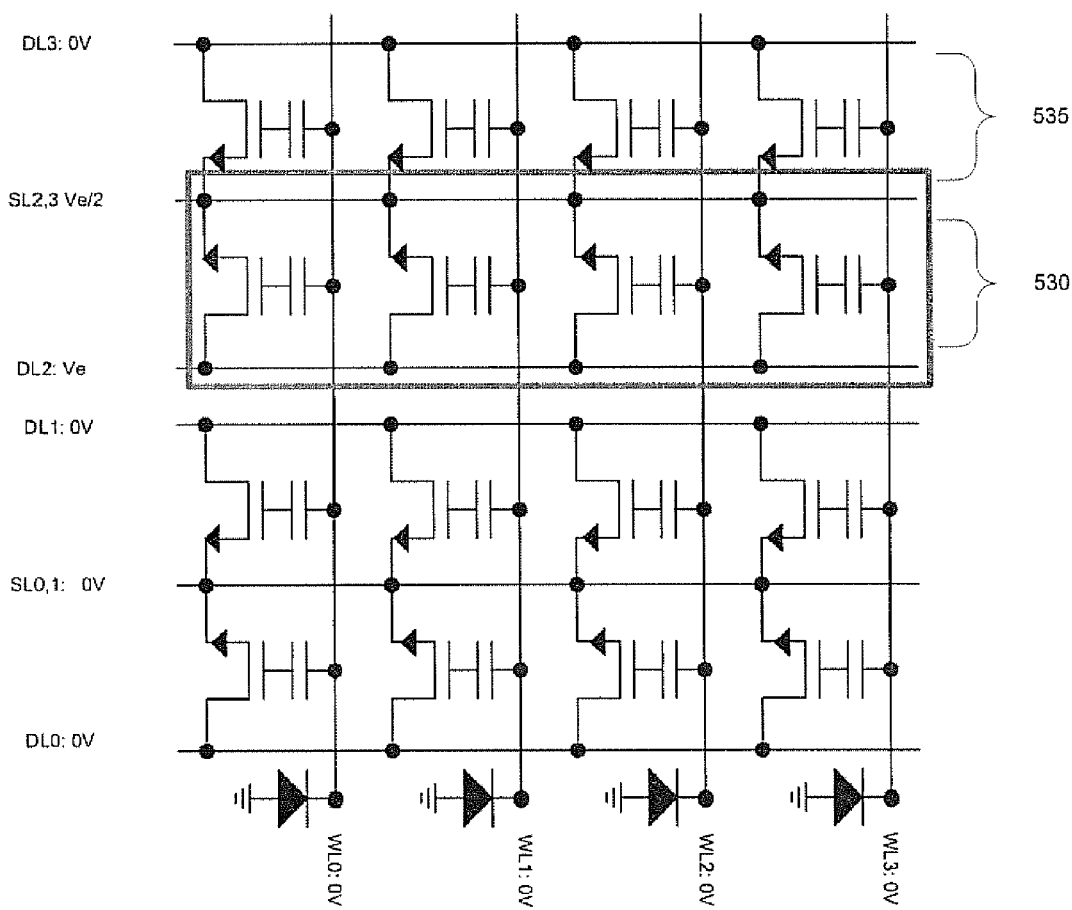
FIG. 5B is an illustration of a column erase operation in a layout of an array of floating gate FETs including shared doped regions and source lines between one or more memory transistors in a column, and wherein each memory cell includes separate gate and drain voltage controls, in accordance with one embodiment of the present disclosure.

FIG. 5B is an illustration of a column erase operation in Array #1 500, wherein each memory cell includes separate source, drain, and gate voltage controls, in accordance with one embodiment of the present disclosure. As shown in FIG. 5B, a combination of voltages is applied to Array #1 to erase memory cells in column 530. That is all the memory cells in column 530 are erased, such that electrons are removed through hot hole injection from floating gates of corresponding memory transistors of the memory cells. In particular, the erase operation is performed at low voltages and implements a hot hole injection or band-to-band tunneling of holes, instead of using Fowler-Nordheim tunneling which typically requires much higher operating voltages (e.g., 12 volts).

Specifically, for column erase 0 V or ground is applied to each of the word lines (e.g., WL0-3, etc.). Also, a ½ Ve voltage is applied to the shared source line corresponding to the column identified for erasure to prevent current flow across the channel. For instance, SL2,3 is associated with columns 530 and 535, and as such to erase column 530, ½ Ve is applied to SL2,3. In another implementation, SL2,3 is left floating. For the remaining source lines, 0 V or ground is applied. To erase column 350, an erase voltage Ve is applied to the corresponding first bit line, or drain line (e.g., DL2), and a voltage of 0 V or ground is applied to remaining drain lines (e.g., DL0, DL1, DL 3, etc.).

Figure 5C:
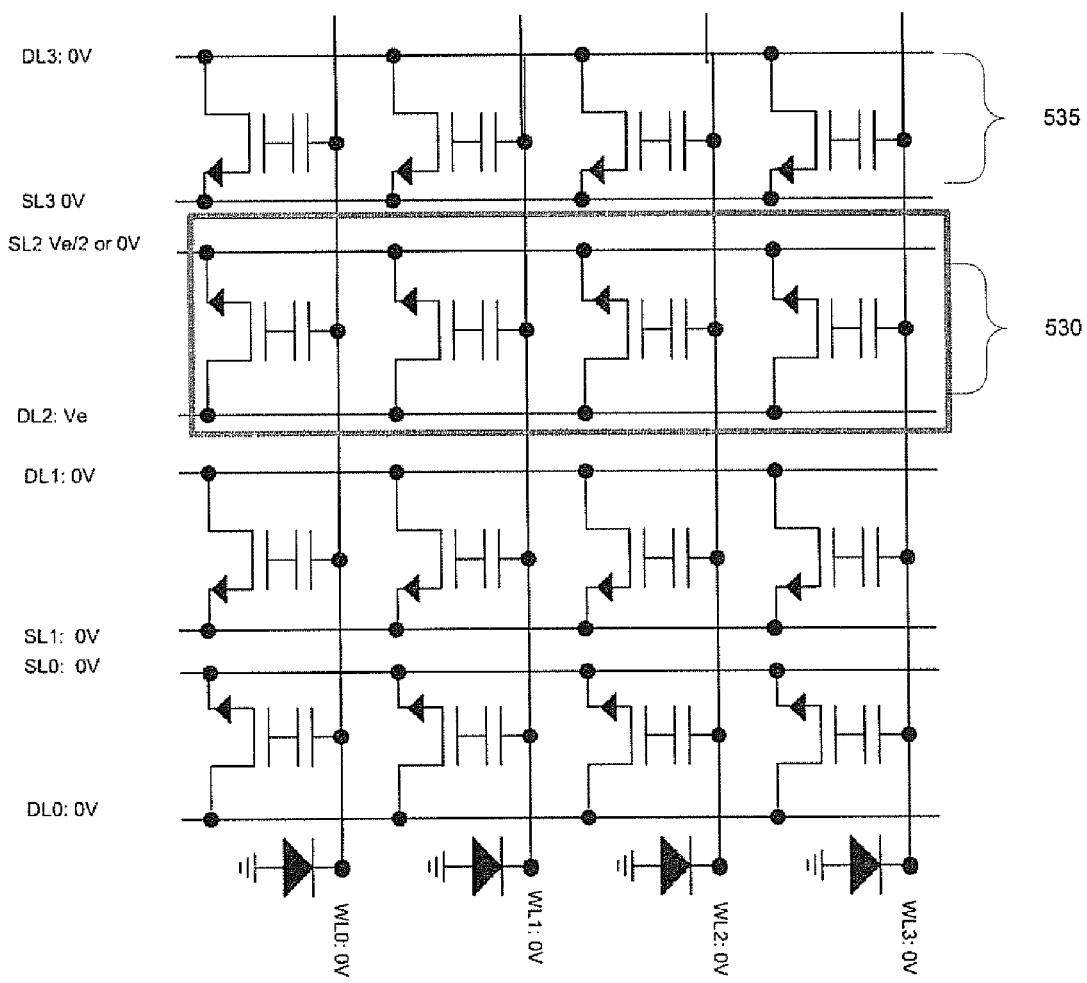
FIG. 5C is an illustration of a column erase operation in a layout of an array of floating gate FETs including shared doped regions between one or more memory transistors in a column, wherein each column has a corresponding and dedicated source line, in accordance with one embodiment of the present disclosure.

FIG. 5C is an illustration of a column erase operation in an Array #1A 500A configuration, wherein each memory cell includes separate source, drain, and gate voltage controls, in accordance with one embodiment of the present disclosure. The configuration and layout of Array #1A 500A is similar to the configuration and layout of Array #1 500; however, instead of shared second bit lines (e.g., source lines) that reduces pitch between identical memory cells, each column of memory cells is associated with a corresponding and dedicated second bit line or source line. Without sharing source lines, the cell size is increased. For instance, in modified Array #1A 500A, SL2 is coupled to source regions of memory transistors in column 530 only, and not also with transistors in column 535, as was previously configured in FIGS. 5A and 5B. This reduces unwanted shared source line disturb, wherein an adjoining column that shares a source line with a column to be erased is also subject to erasure without proper care. In modified Array #1A 500A, source line disturb is eliminated as there are no shared source lines. As such, for the modified Array #1A 500A, the erase operation is also performed at low voltages using hot hole injection or band-to-band tunneling of holes. Specifically, 0 V or ground is applied to each of the word lines (e.g., WL0-3, etc.). Also, a ½ Ve voltage is applied to the SL2. For the remaining source lines, 0 V or ground is applied. Additionally, in another implementation 0 V may also be applied to SL2, or it may be left floating.

While the modified Array #1A 500A is shown in FIG. 5C to illustrate column erase, the configuration in Array #1A 500A may also be used for all operations, including programming a bit, row erase, read, etc.

Figure 5D:
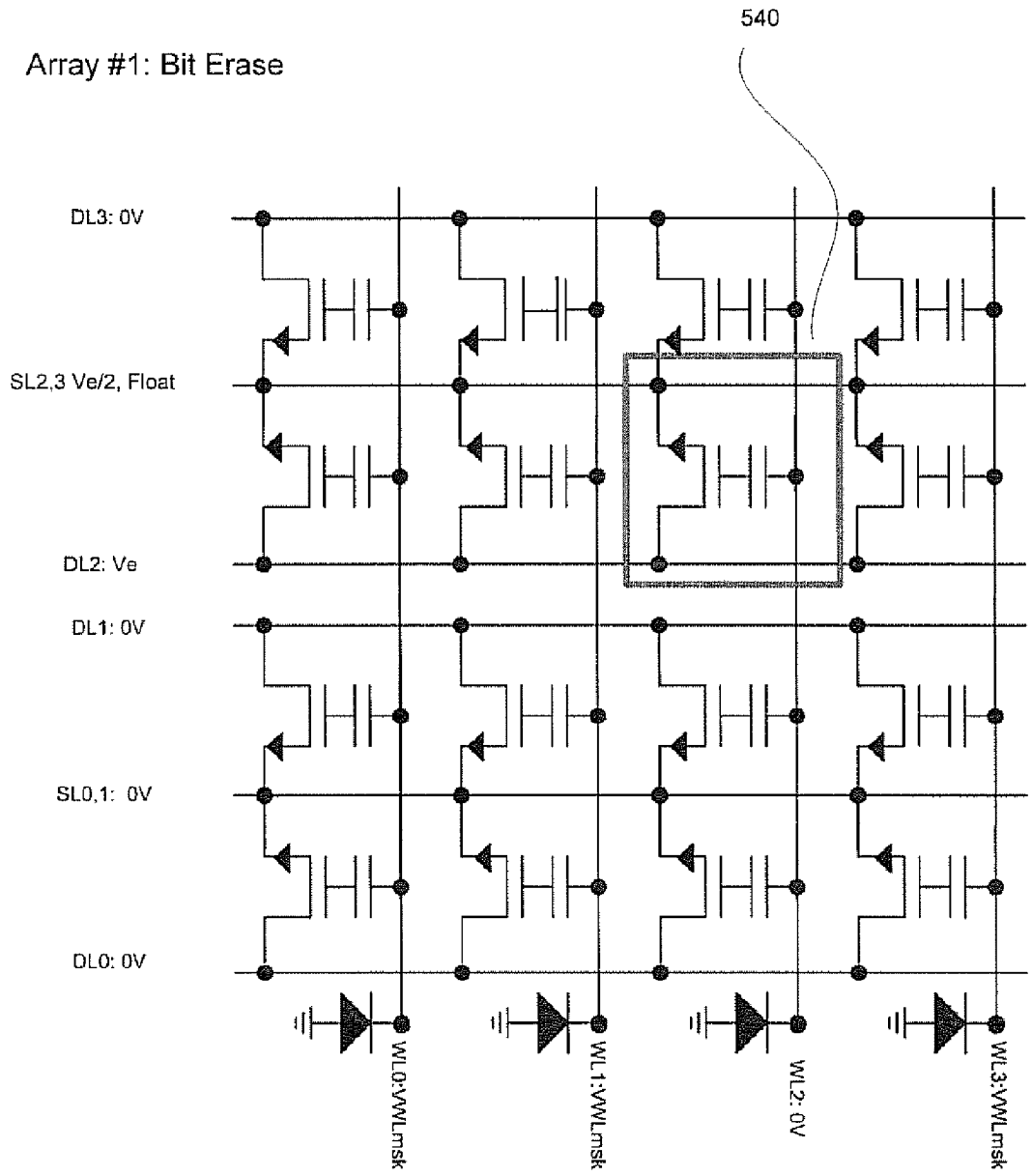
FIG. 5D is an illustration of a bit erase operation in a layout of an array of floating gate FETs including shared doped regions and source lines between one or more memory transistors in a column, and wherein each memory cell includes separate gate and drain voltage controls, in accordance with one embodiment of the present disclosure.

FIG. 5D is an illustration of a bit erase operation in Array #1 500, wherein each memory cell includes separate source, drain, and gate voltage controls, in accordance with one embodiment of the present disclosure. Also, source lines are shared between pairs of columns of memory cells in Array #1 500, as in FIGS. 5A-B. As shown in FIG. 5D, a combination of voltages is applied to Array #1 500 to erase a bit or memory cell 540. In particular, the erase operation is performed at low voltages and implements a hot hole injection or band-to-band tunneling of holes, instead of using Fowler-Nordheim tunneling which typically requires much higher operating voltages (e.g., 12 volts).

Specifically, for bit erase 0 V or ground is applied to WL2 that is coupled to memory cell 540. The remaining word lines (e.g., WL0, WL1, WL3, etc.) are masked with a masking voltage VWLmsk. In one implementation, VWLmsk is ½ Ve. Also, a ½ Ve voltage is applied to the shared source line corresponding to the bit identified for erasure to prevent current flow across the channel. For instance, SL2,3 is associated with bit 540, and as such to erase bit 540, ½ Ve is applied to SL2,3. In another implementation, SL2,3 is left floating. For the remaining source lines (SL0,1, etc.), 0 V or ground is applied. In addition, to erase bit 540, an erase voltage Ve is applied to the corresponding first bit line, or drain line (e.g., DL2), and a voltage of 0 V or ground is applied to remaining drain lines (e.g., DL0, DL1, DL 3, etc.).

Figure 5E:
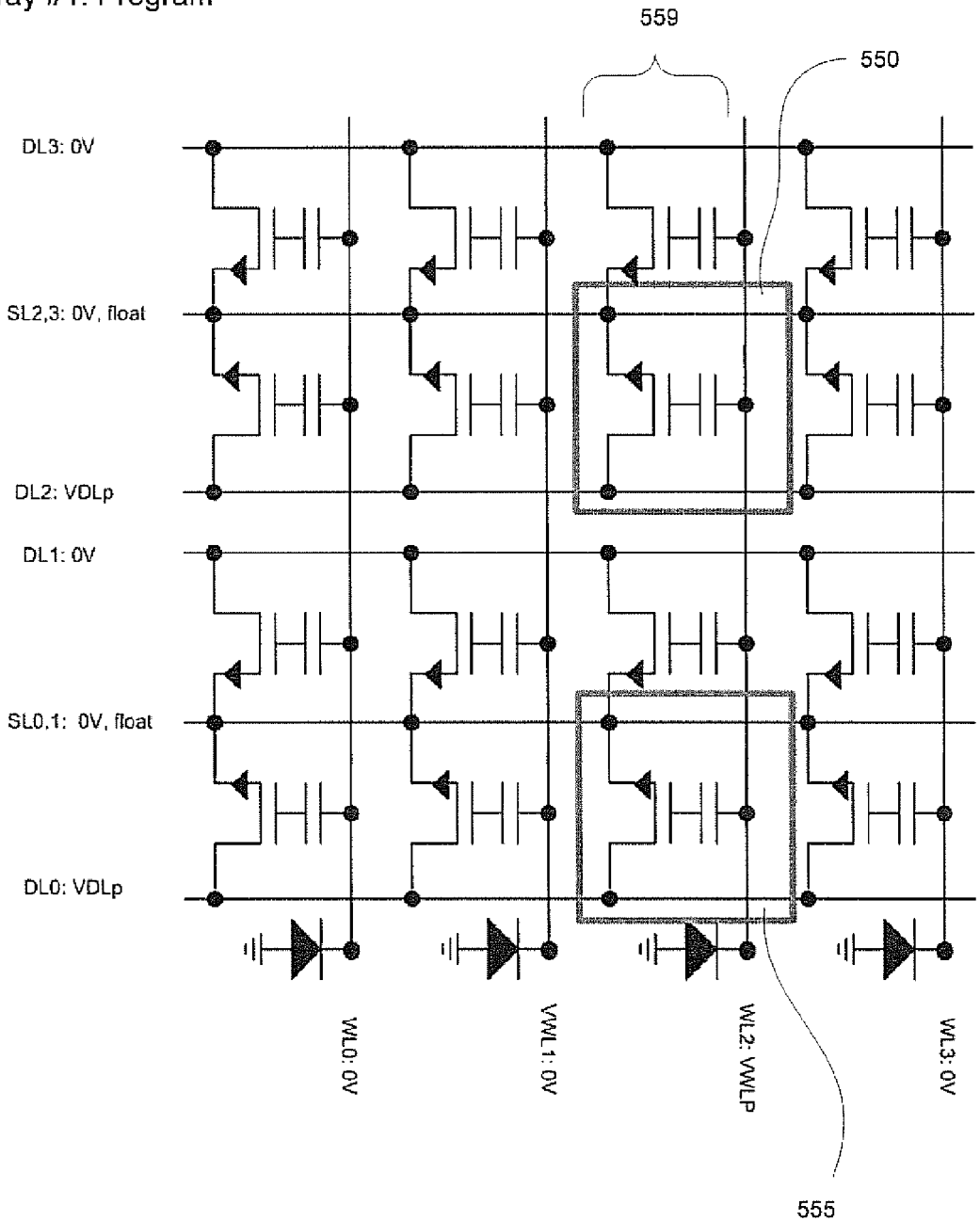
FIG. 5E is an illustration of a program operation for one or more bits in a layout of an array of floating gate FETs including shared doped regions and source lines between one or more memory transistors in a column, and wherein each memory cell includes separate gate and drain voltage controls, in accordance with one embodiment of the present disclosure.

FIG. 5E is an illustration of a bit write or program operation in Array #1 500 for one or more bits, wherein each memory cell includes separate source, drain, and gate voltage controls, in accordance with one embodiment of the present disclosure. Also, source lines are shared between pairs of columns of memory cells in Array #1 500, as in FIGS. 5A-B. As shown in FIG. 5E, a combination of voltages is applied to Array #1 500 to program a bit or memory cell. In FIG. 5E, bits 550 and 555 are programmed simultaneously, but the principles outlined in FIG. 5E can be applied to program a single bit. In particular, the program operation is performed at low voltages and implements a source side hot electron injection to the floating gate. Moreover, as previously described in relation to FIG. 3, hot electron injection is performed on the source side of the programmed memory cell (e.g., 550 and/or 555), which is facilitated through the use of the asymmetric characteristics of the source and drain regions of the floating gate memory transistor used in Array #1 500. In other embodiments, transistors with symmetrical source and drain regions are implemented for electron injection.

Specifically, memory cell 550 is used for illustration purposes to show the various voltages applied for programming a single bit. In particular, a word line program voltage (VWLprogram or VWLP) is applied to WL2 that is coupled to memory cell 550. The remaining word lines (e.g., Wl0, WL1, WL3, etc.) are held at ground or 0 V. Also, all of the source lines (e.g., SL0,1; SL 2,3, etc.) are held at ground (e.g., 0 V). To isolate programming to memory cell 550, a drain line program voltage (VDLprogram) is applied to the corresponding drain line DL2.

As shown in FIG. 5E, one or more memory cells of a corresponding row 559 of memory cells can be programmed simultaneously through application of the drain programming voltage (VDLprogram) to the appropriate drain lines. For instance, to program memory cell 555 at the same time memory cell 550 is programmed, the programming voltage (VDLprogram) is applied to the corresponding drain line DL0. Of course, appropriate voltages are applied to the word lines and source lines as previously described. In that manner, one or more memory cells in row 559 are programmed simultaneously.

Figure 5F:
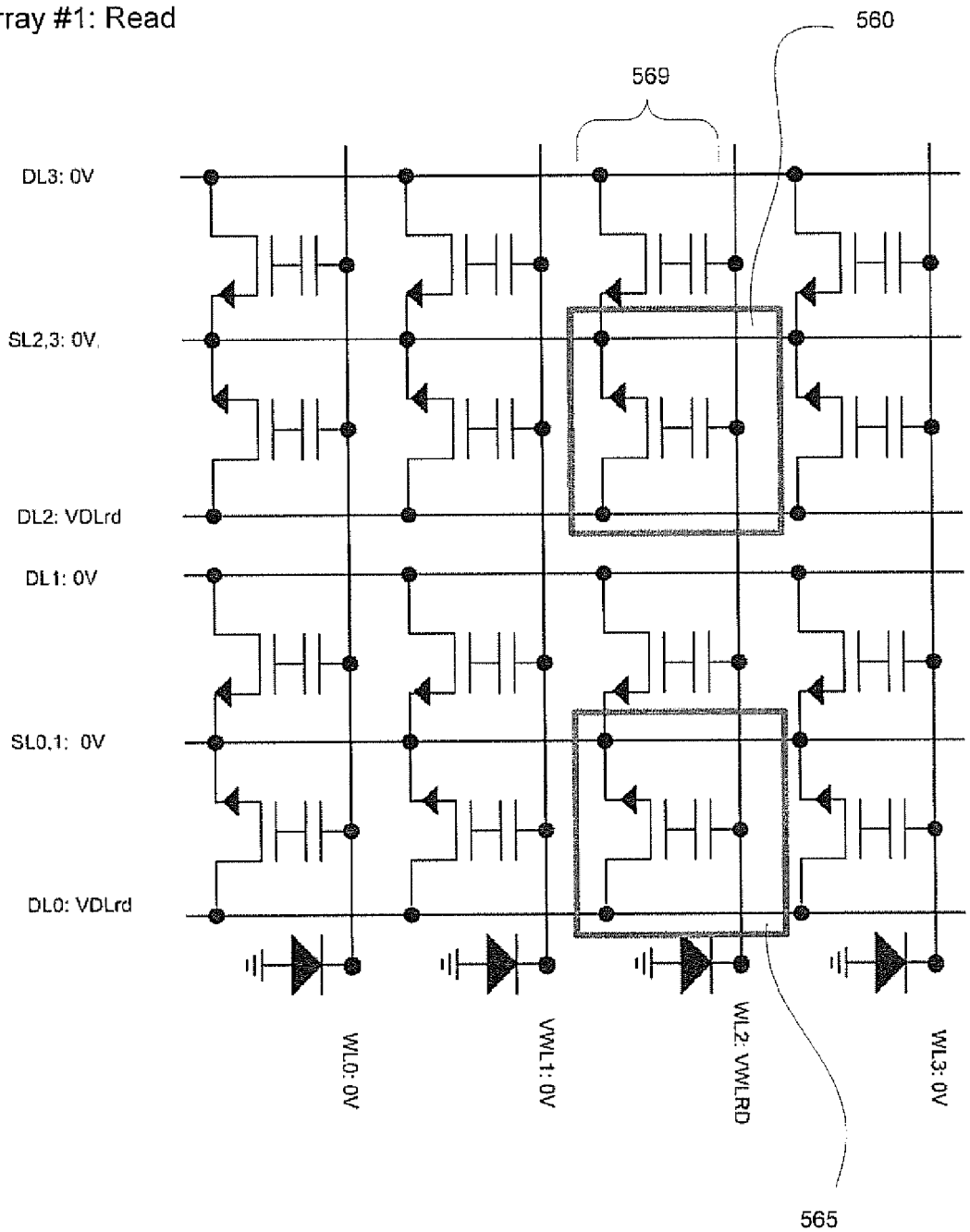
FIG. 5F is an illustration of a read operation for one or more bits in a layout of an array of floating gate FETs including shared doped regions and source lines between one or more memory transistors in a column, and wherein each memory cell includes separate gate and drain voltage controls, in accordance with one embodiment of the present disclosure.

FIG. 5F is an illustration of a bit read operation in Array #1 500 for one or more bits, wherein each memory cell includes separate source, drain, and gate voltage controls, in accordance with one embodiment of the present disclosure. Also, source lines are shared between pairs of columns of memory cells in Array #1 500, as in FIGS. 5A-B. As shown in FIG. 5F, a combination of voltages is applied to Array #1 500 to read a bit or memory cell. In FIG. 5F, bits 560 and 565 are read simultaneously, but the principles outlined in FIG. 5F can be applied to read a single bit. Specifically, bit 560 is used for illustration purposes to show the various voltages applied for reading a single memory cell. In particular, a voltage read (VWLRD or VWLread) is applied to WL2 that is coupled to memory cell 560. The remaining word lines (e.g., WL0, WL1, WL3, etc.) are held at ground or 0 V. Also, all of the source lines (e.g., SL0,1; SL 2,3; etc.) are held at ground (e.g., 0 V). To isolate programming to memory cell 560, a drain line read voltage (VDLrd or VDLread) is applied to the corresponding drain line DL2 and the resulting current is measured by a sense amplifier to determine if the memory cell 560 is programmed or erased. Alternatively, the corresponding drain line DL2 can be precharged to VDLread and then released, allowing the memory cell 560 to either pull it low (if erased) or not (if programmed).

As shown in FIG. 5F, one or more memory cells of a corresponding row 569 of memory cells can be read simultaneously through application of the drain read voltage (VDLread) to the appropriate drain lines. For instance, to read memory cell 565 at the same time memory cell 560 is read, the read voltage (VDLread) is applied to the corresponding drain line DL0 while applying appropriate voltages to the word lines and source lines as previously described. In that manner, one or more memory cells in row 569 are read simultaneously.

Figure 6:
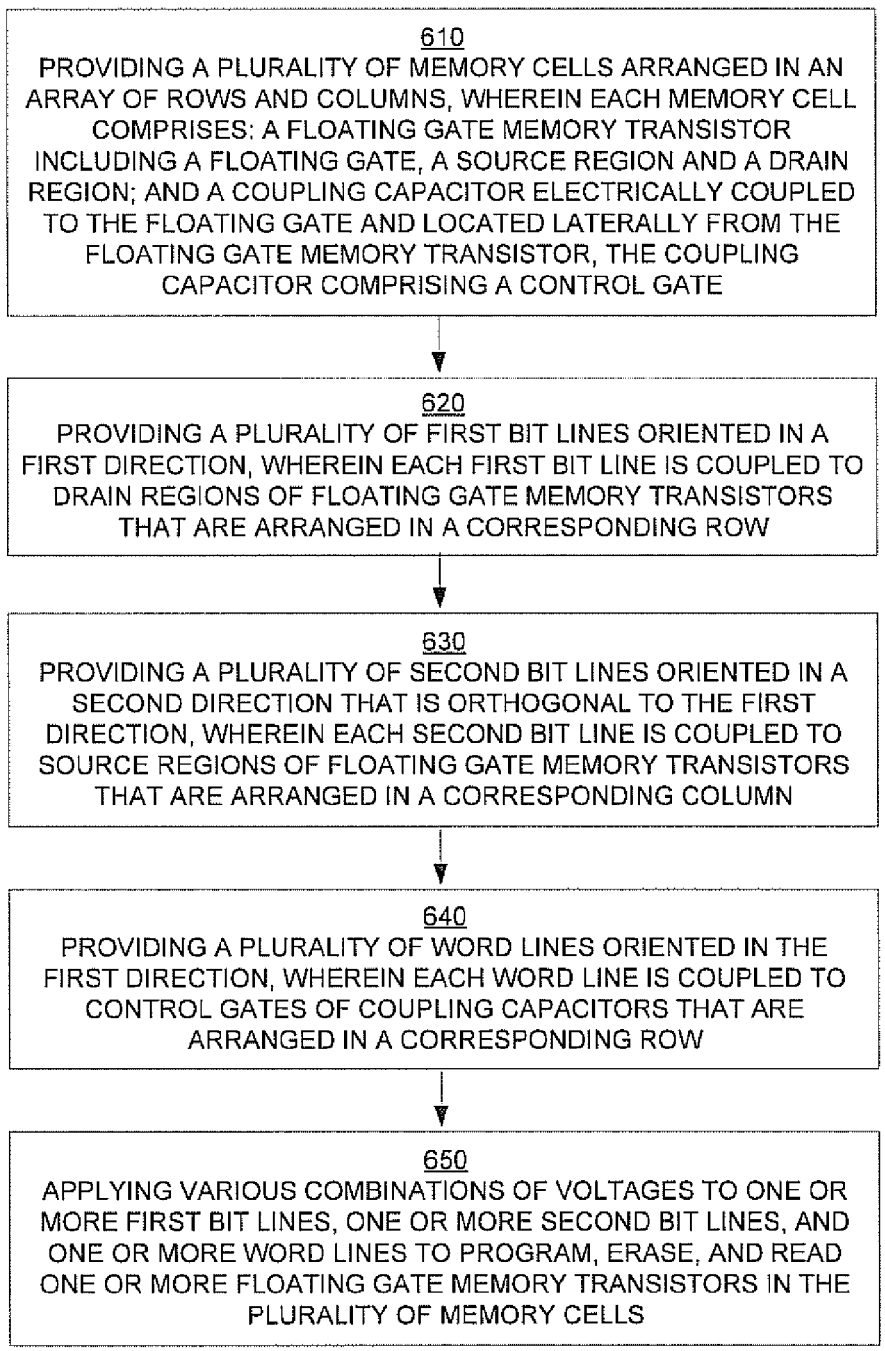
FIG. 6 is a flow chart illustrating a method of forming an array of floating gate FETs having first bit lines oriented in a first direction and second bit lines oriented in a second direction, and wherein each memory cell includes separate gate and drain voltage controls, in accordance with one embodiment of the present disclosure.

FIGS. 6 and 7A-E combined illustrate a method and device for operating an array of floating gate MOSFETs. Specifically, FIG. 6 is a flow chart 600 illustrating a method of operating an array of floating gate FETs including shared doped regions having n-type or p-type dopants (e.g., n-doped regions, such as actively doped N+ regions and/or n-wells) capacitively coupled to one or more memory cells, and wherein each memory cell includes separate gate and drain voltage controls, in accordance with one embodiment of the present disclosure. FIGS. 7A-E illustrate a configuration of Array #2 in which a common doped region is capacitively coupled to one or more memory cells, and provide specific operational uses of Array #2. That is, in some embodiments, the method outlined in flow chart 600 is implemented within a configuration of memory cells, such as, that disclosed by Array #2 of FIGS. 7A-E.

Turning now to FIG. 6, flow chart 600 illustrates a method for operating an array (e.g., Array #2) including memory cells driven by separate drain and gate voltage sources, in accordance with one embodiment of the present disclosure. The memory cell 100 is implemented within the array outlined in flow chart 600, in one embodiment.

At 610, a plurality of memory cells is provided and arranged in an array of rows and columns. Each of the memory cells includes a floating memory transistor that comprises a floating gate, a source region, and a drain region. The memory cell also includes a coupling capacitor that has a first terminal electrically coupled to the floating gate. The coupling capacitor is located laterally from the floating gate memory transistor. In one embodiment, the second coupling capacitor terminal is coupled to the common doped region and comprises a control gate, in that a portion of voltages applied to the capacitor are capacitively coupled to the floating gate, wherein the capacitor comprises a common doped region shared by one or more memory cells.

At 620, a plurality of first bit lines is provided, each of which is oriented in first direction. Moreover, each first bit line is coupled to drain regions of corresponding floating gate memory transistors that are arranged and/or configured in a corresponding row. A plurality of memory cells including the corresponding floating gate memory transistors are also arranged and/or configured in a row in the memory array. The first bit lines may be referred to as drain lines.

At 630, a plurality of second bit lines is provided in the memory array. Each second bit line is oriented in a second direction that is approximately orthogonal to the first direction. Moreover, each second bit line is coupled to source regions of corresponding floating gate memory transistors that are arranged and/or configured in the corresponding column. Memory cells including the corresponding floating gate memory transistors are also arranged and/or configured in the corresponding column in the memory array. The second bit lines may be referred to as source lines.

At 640, a plurality of word lines is provided in the memory array. Each of the word lines is oriented in the first direction. In that manner, the word lines are approximately parallel to the first bit lines, or drain lines. Each word line is coupled to control gates of the coupling capacitors that are arranged in a corresponding row. That is, a row includes one or more memory cells, wherein a memory cell includes a memory transistor that includes a floating gate that is capacitively coupled to a capacitor acting as a control gate. In one embodiment, the capacitor is formed from a doped region that is common to one or more memory cells, each of which having separate gate, drain, and source voltage controls. In one implementation, the doped region is common to memory cells in the row. In that manner, a voltage placed on the common doped region forming part of the capacitor is also applied in part to the floating gate.

At 650, various combinations of voltages are applied to one or more of the first bit lines, one or more of the second bit lines, and one or more of the word lines to program, erase and read one or more of the floating gate memory transistors in corresponding memory cells in the plurality of memory cells. For instance, combinations of voltages may be applied to erase a row of memory cells, program one or more bits or memory cells in a row of memory cells, and read one or more memory cells in a row.

FIGS. 7A-E are illustrations of various operations performed on a configuration of memory cells of a first array (Array #2), in which a common doped region having n-type or p-type dopants (e.g., n-doped regions, such as actively doped N+ regions and/or n-wells) is capacitively coupled to one or more memory cells. More particularly, operations include bit program, row program, row erase, column erase, and bit and/or row read. For purposes of the present application, rows are oriented up and down the pages and memory arrays as presented in FIGS. 7A-E, while columns are oriented right and left across the pages and memory arrays.

The memory cell configuration or layout of Array #2 is illustrated in each of FIGS. 7A-E, and includes a plurality of memory cells arranged in an array of rows and columns. Each of the memory cells includes a floating gate memory transistor including a floating gate, a source region, and a drain region. Each memory cell also includes a coupling capacitor that is electrically coupled to the floating gate and located laterally from the floating gate transistor. The capacitor is capacitively coupled to the floating gate. The capacitor terminal coupled to the doped region acts as a control gate as a portion of a voltage applied to the capacitor (e.g., to the doped region) is applied to the floating gate through capacitive coupling. Array #2 also includes a plurality of first bit lines (e.g., DL0, DL1, DL2, DL3, etc.), each of which is oriented in a first direction. Each first bit line is coupled to drain regions of one or more floating gate memory transistors arranged in a corresponding row, wherein a first bit line is also referred to as a drain line. Array #2 also includes a plurality of second bit lines (e.g., SL0, SL1, SL2, SL3, etc.), each of which is oriented in a second direction that is approximately orthogonal to the first direction. Each second bit line is coupled to source regions of one or more floating gate memory transistors arranged in a corresponding column, wherein a second bit line is also referred to as a source line. Also, a plurality of word lines is included in Array #2 (e.g., WL0, WL1, WL2, WL3, etc.), wherein each word line is oriented in the first direction. Each word line is coupled to coupling capacitors through a corresponding doped region, wherein the terminals coupling the capacitors to the doped region act as control gates to memory transistors configured in a row of Array #2. As shown, the doped region is common to one or more memory cells configured in a row. For instance, doped region 715 is coupled to WL2 of a corresponding row of memory cells.

In still another embodiment, a plurality of sense amplifiers and bit line drivers are coupled to the plurality of first and/or second bit lines for facilitating program, read, and erase operations. In other embodiments, instead of sense amplifiers, any means suitable for measuring current or voltage is coupled to the plurality of first and/or second bit lines. The sense amplifier and/or measuring means are used for purposes of measuring current or voltage when performing programming, erase, and read operations on the array.

Figure 7A:
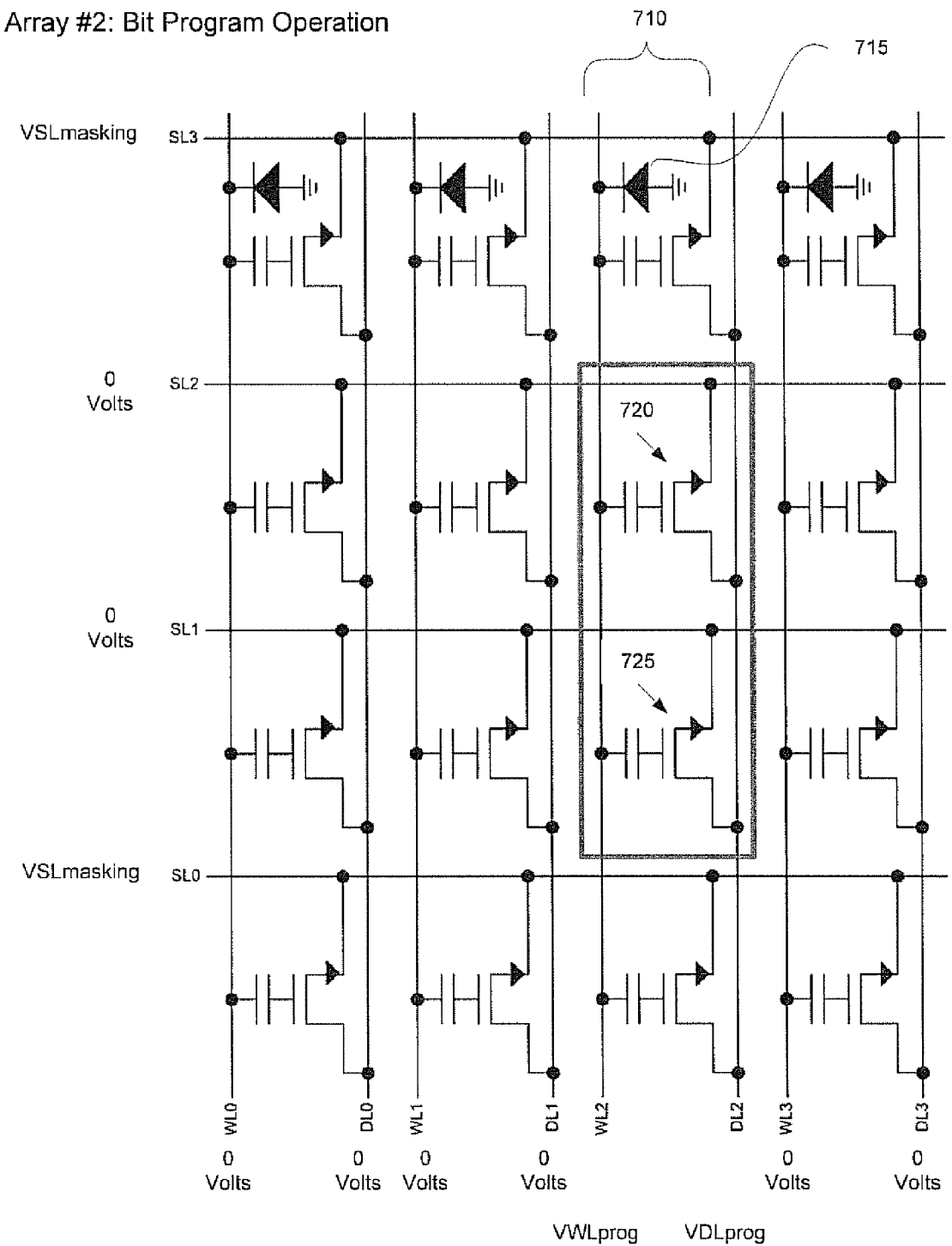
FIG. 7A is an illustration of a bit program operation in a layout of an array of floating gate FETs including first bit (drain) and word lines oriented in a first direction, second bit (source) lines oriented in a second direction, and wherein each memory cell includes separate gate and drain voltage controls, in accordance with one embodiment of the present disclosure.

FIG. 7A is an illustration of a bit write operation in Array #2 700, wherein each memory cell includes separate source, drain, and gate voltage controls, in accordance with one embodiment of the present disclosure. As shown in FIG. 7A, a combination of voltages is applied to Array #2 700 to program one or more memory cells in row 710. In FIG. 7A, memory cells 720 and 725 are programmed simultaneously, but the principles outlined in FIG. 7A can be applied to program a single memory cell. In particular, the program operation is performed at low voltages and implements a hot electron injection method of programming, instead of using Fowler-Nordheim tunneling which typically requires much higher operating voltages (e.g., 12 volts). As previously described in relation to FIG. 3, hot electron injection is performed on the source side of the programmed memory cells (e.g., 720 and/or 725), which is facilitated through the use of the asymmetric characteristics of the source and drain regions of the floating gate memory transistor used in Array #2 700. In other embodiments, transistors with symmetrical source and drain regions are implemented for electron injection.

Specifically, memory cell 720 is used for illustration purposes to show the various voltages applied for programming a single bit. In particular, a word line program voltage (VWLP or VWLprogram) is applied to WL2 that is coupled to memory cell 720. The remaining word lines (e.g., WL0, WL1, WL3, etc.) are held at ground or 0 V. Also, the corresponding source line (e.g., SL2) is held at ground (e.g., 0 V). Remaining source lines in the Array #2 700 are masked with a masking voltage (VSLmasking). More particularly, for memory cells in row 710 to be programmed, corresponding source lines are brought to 0 V, while all remaining source lines are masked with a masking voltage. To further isolate programming to memory cell 710, a drain line programming voltage (VDLprog or VDL program) is applied to the corresponding drain line DL2. Remaining drain lines (e.g., DL0, DL1, DL3, etc.) are held at ground or 0 V.

As shown in FIG. 7A, one or more memory cells of a corresponding row 710 of memory cells can be programmed simultaneously through application of voltages on appropriate source lines. For instance, to program memory cells in row 710, VWLprogram is applied to WL2, wherein all remaining word lines are held at ground or 0V. Also, VDLprogram is applied to DL2, wherein all remaining drain lines are held at ground or 0 V. Thereafter, to program memory cell 725 at the same time memory cell 720 is programmed, SL 1 is held at ground or 0 V. Other memory cells in row 710 can be similarly programmed by applying 0 V or ground to their corresponding source lines.

Figure 7B:
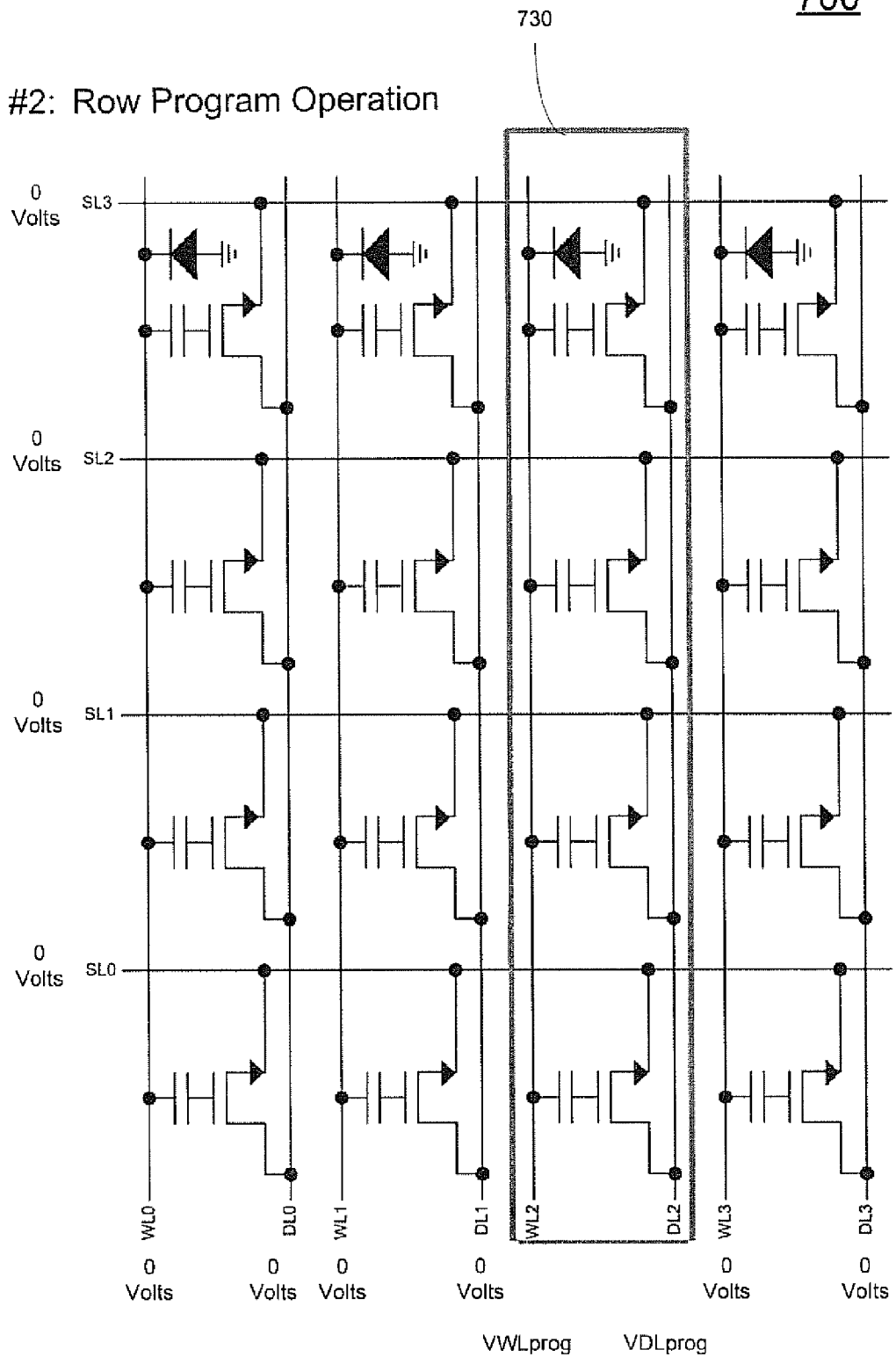
FIG. 7B is an illustration of a row program operation in a layout of an array of floating gate FETs including first bit (drain) and word lines oriented in a first direction and second bit (source) lines oriented in a second direction, and wherein each memory cell includes separate gate and drain voltage controls, in accordance with one embodiment of the present disclosure.

FIG. 7B is an illustration of a row program operation in Array #2 700, wherein each memory cell includes separate source, drain, and gate voltage controls, in accordance with one embodiment of the present disclosure. As shown in FIG. 7B, a combination of voltages is applied to Array #2 700 to program the memory cells in row 710. In particular, the program operation is performed at low voltages and implements a hot electron injection of electrons to the floating gate, instead of using Fowler-Nordheim tunneling which typically requires much higher operating voltages (e.g., 12 volts). Moreover, as previously described in relation to FIG. 3, hot electron injection is performed on the source side of the programmed memory cells in row 730, which is facilitated through the use of the asymmetric characteristics of the source and drain regions of the floating gate memory transistor used in Array #2 700. In other embodiments, transistors with symmetrical source and drain regions are implemented for hot electron injection.

Specifically, to program memory cells in row 730, a word line program voltage (VWLP or VWLprogram) is applied to WL2 that is coupled to memory cells in row 730. The remaining word lines (e.g., Wl0, WL1, WL3, etc.) are held at ground or 0 V. Also, all the source lines (e.g., SL0-3, etc.) is held at ground (e.g., 0 V). No masking voltages are applied to the source lines. To further isolate programming to memory cells in row 730, a drain line programming voltage (VDLprog or VDL program) is applied to the corresponding drain line DL2 while the remaining drain lines (e.g., DL0, DL1, DL3, etc.) are held at ground or 0 V.

Figure 7C:
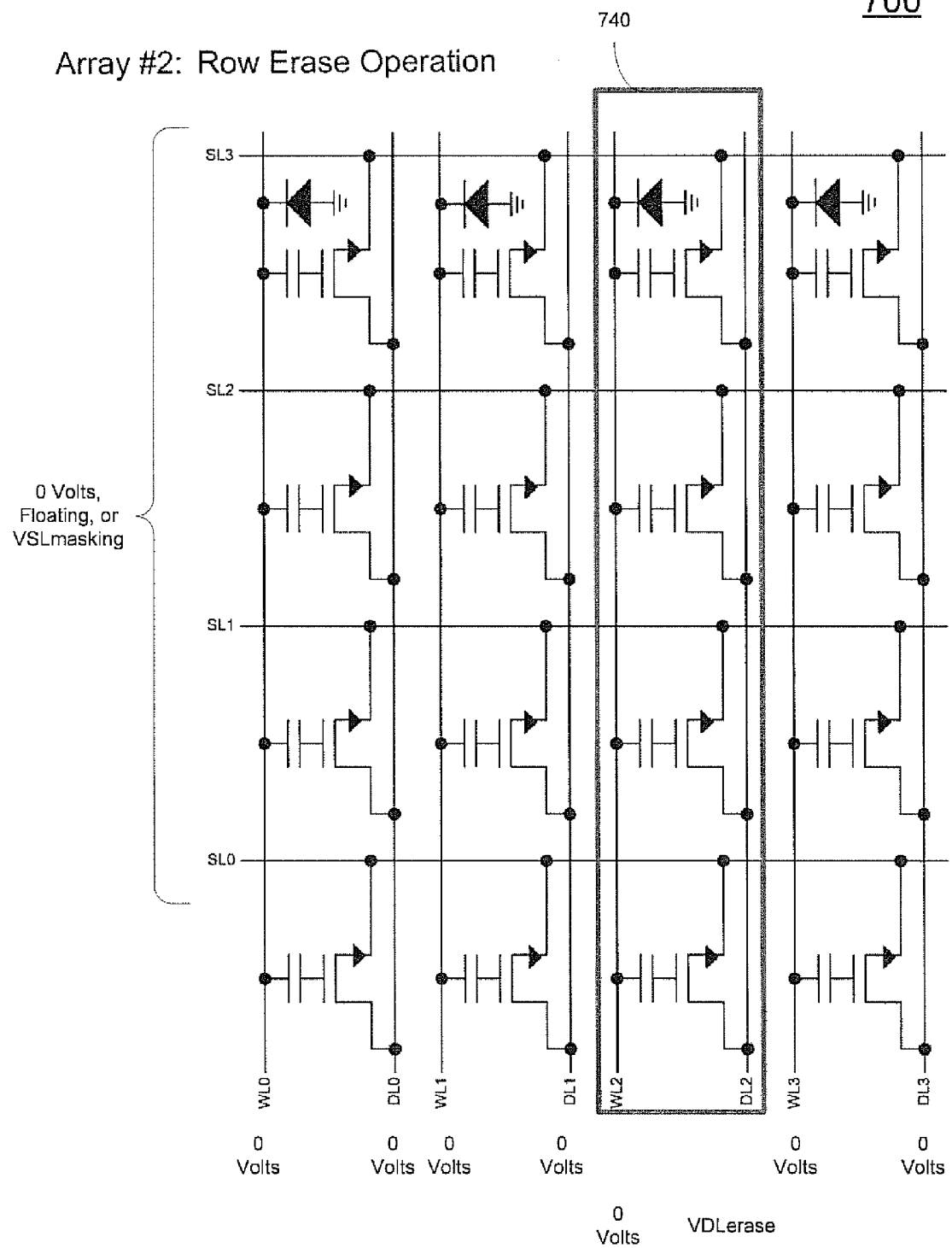
FIG. 7C is an illustration of a row erase operation in a layout of an array of floating gate FETs including first bit (drain) and word lines oriented in a first direction and second bit (source) lines oriented in a second direction, and wherein each memory cell includes separate gate and drain voltage controls, in accordance with one embodiment of the present disclosure.

FIG. 7C is an illustration of a row erase operation in a layout of Array #2 700, wherein each memory cell includes separate source, drain, and gate voltage controls, in accordance with one embodiment of the present disclosure. As shown in FIG. 7C, a combination of voltages is applied to Array #2 700 to erase memory cells in row 740. That is, all the memory cells in row 740 are erased, such that electrons are removed through hot hole injection from floating gates of corresponding memory transistors of the memory cells. In particular, the erase operation is performed at low voltages and implements a hot hole injection or band-to-band tunneling of holes, instead of using Fowler-Nordheim tunneling which typically requires much higher operating voltages (e.g., 12 volts).

Specifically, for row erase 0 V or ground is applied to the plurality of word lines (e.g., WL0-3, etc.). A portion of these voltages are subsequently applied through capacitive coupling to the floating gates of memory transistors in row 740. Also, a high voltage (VDLerase) is applied to the first bit line, or drain line DL2 that is coupled to memory transistors in row 740. For instance, an erase voltage (e.g., approximately 6 V) is applied to drain line DL2. Further, with regards to the plurality of second bit lines or source lines (e.g., SL0-3, etc.), the source lines are left floating in one implementation. Alternatively, 0 V or ground is applied to the source lines in another implementation, or a masking voltage (e.g., ½ Ve) may be applied to the source lines in yet another implementation.

Figure 7D:
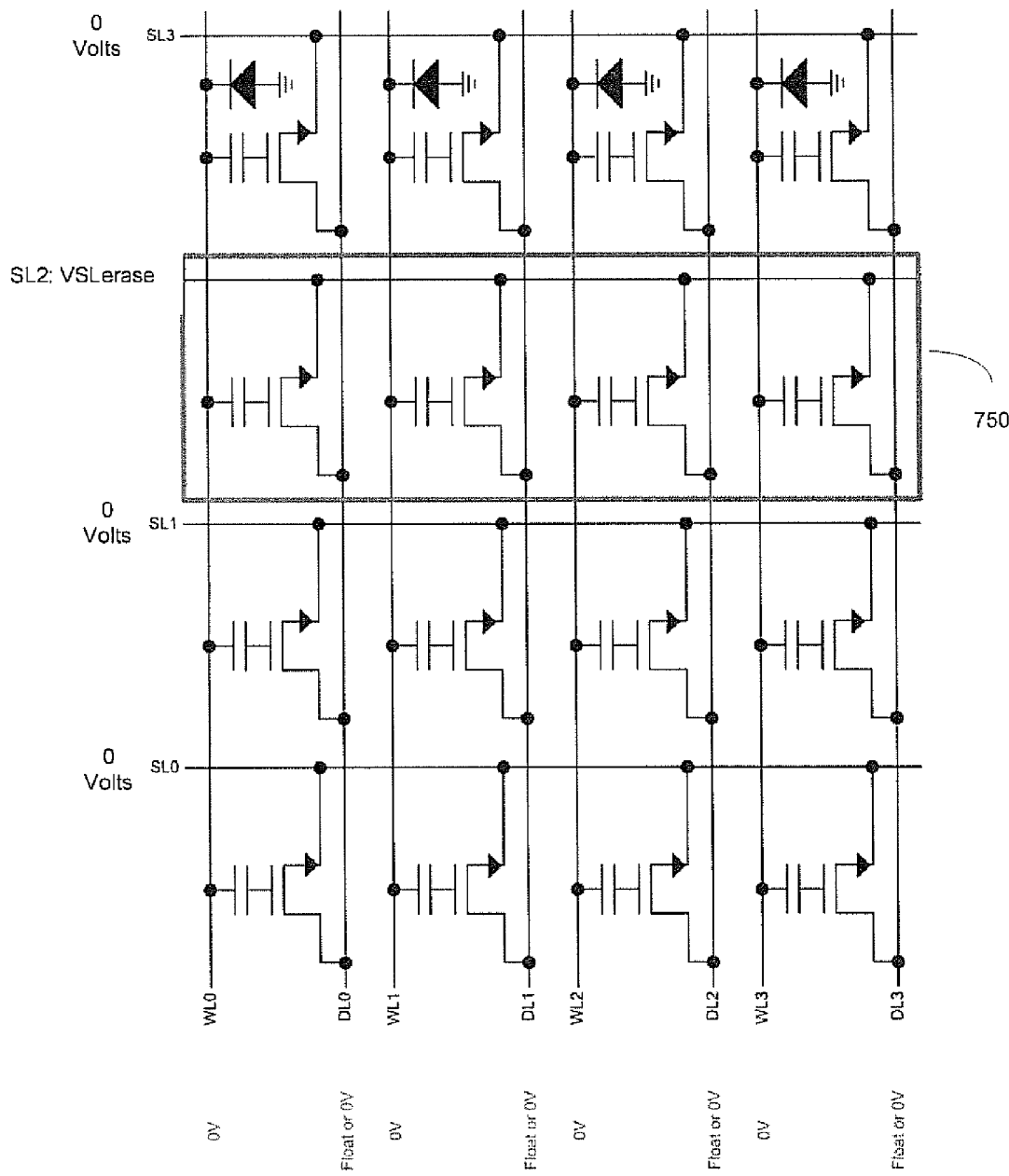
FIG. 7D is an illustration of a column erase operation in a layout of an array of floating gate FETs including first bit (drain) and word lines oriented in a first direction and second bit (source) lines oriented in a second direction, and wherein each memory cell includes separate gate and drain voltage controls, in accordance with one embodiment of the present disclosure.

FIG. 7D is an illustration of a column erase operation in Array #2 700, wherein each memory cell includes separate source, drain, and gate voltage controls, in accordance with one embodiment of the present disclosure. As shown in FIG. 7D, a combination of voltages is applied to Array #2 700 to erase memory cells in column 750. That is all the memory cells in column 750 are erased, such that electrons are removed through hot hole injection from the floating gates of corresponding memory transistors of the memory cells. In particular, the erase operation is performed at low voltages and implements a hot hole injection or band-to-band tunneling of holes, instead of using Fowler-Nordheim tunneling which typically requires much higher operating voltages (e.g., 12 volts).

Specifically, for column erase 0 V or ground is applied to each of the word lines (e.g., WL0-3, etc.). Also, a source line erase voltage (VSLerase) is applied to the source line SL2 corresponding to column 750 that is identified for erasure. For the remaining source lines (e.g., SL0, SL1, SL3, etc.), 0 V or ground is applied. In addition, 0 V or ground is applied to the plurality of first bit lines, or drain lines (e.g., DL0-3, etc.), in one implementation. In another implementation, the plurality of drain lines is left floating.

Figure 7E:
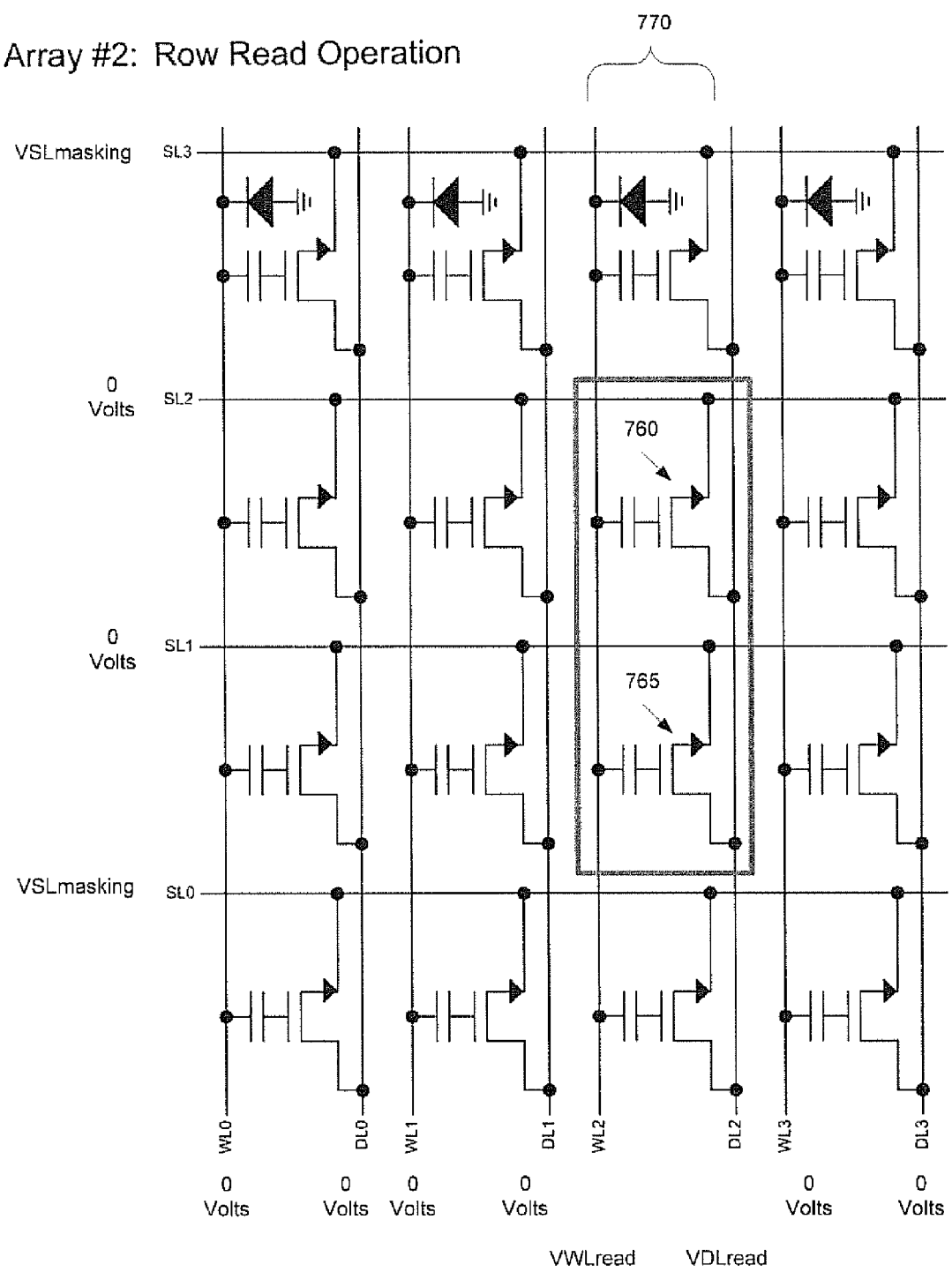
FIG. 7E is an illustration of a row read operation in a layout of an array of floating gate FETs including first bit (drain) and word lines oriented in a first direction and second bit (source) lines oriented in a second direction, and wherein each memory cell includes separate gate and drain voltage controls, in accordance with one embodiment of the present disclosure.

FIG. 7E is an illustration of a memory cell read operation in Array #2 700, wherein each memory cell includes separate source, drain, and gate voltage controls, in accordance with one embodiment of the present disclosure. As shown in FIG. 7E, a combination of voltages is applied to Array #2 700 to read a bit or memory cell. In FIG. 7E, bits 760 and 765 are read simultaneously, but the principles outlined in FIG. 7E can be applied to read a single bit. Specifically, bit 760 is used for illustration purposes to show the various voltages applied for reading a single memory cell. In particular, a word line read voltage (VWLread) is applied to WL2 that is coupled to memory cell 760. The remaining word lines (e.g., Wl0, WL1, WL3, etc.) are held at ground or 0 V.

Also, the corresponding source line (e.g., SL2) is held at ground (e.g., 0 V). The remaining source lines in the Array #2 700 are masked with a masking voltage (VSLmasking). More particularly, for memory cells in row 770 to be read, corresponding source lines are brought to 0 V, while all remaining source lines are masked with a masking voltage. To further isolate the read operation to memory cell 760, a drain line read voltage (VDLread) is applied to the corresponding drain line DL2. Remaining drain lines (e.g., DL0, DL1, DL3, etc.) are held at ground or 0 V.

As shown in FIG. 7E, one or more memory cells of a corresponding row 770 of memory cells can be read simultaneously through application of voltages on appropriate source lines. For instance, to perform read operations on memory cells in row 770, VWLread is applied to WL2, wherein all remaining word lines are held at ground or 0 V. Also, VDLread is applied to DL2, wherein all remaining drain lines are held at ground or 0 V. Thereafter, to perform a read operation on memory cell 765 at the same time memory cell 760 is read, SL1 is held at ground or 0 V. Other memory cells in row 770 can be similarly read by applying 0 V or ground to corresponding source lines.

After being driven to ground, the source lines are released. In the columns where the memory cell is erased, the source line will be pulled up to VDLread by sense current through the memory cell. In columns where the memory cell is programmed, no sense current will flow through the memory cell and it will stay at 0 V or ground. The read is performed by sense amplifiers on the source lines SL0-SL3 which detect the voltages on the source lines.

In an alternate embodiment, the read can be performed by driving all of the drain lines to 0 V or ground, precharging the source lines to a positive voltage, releasing them, and sensing the voltages on the source lines with sense amplifiers to determine which sense lines are pulled down (by erased memory cells) and which are not (by programmed memory cells. Other sensing methods are possible within the scope of the invention.

Figure 8:
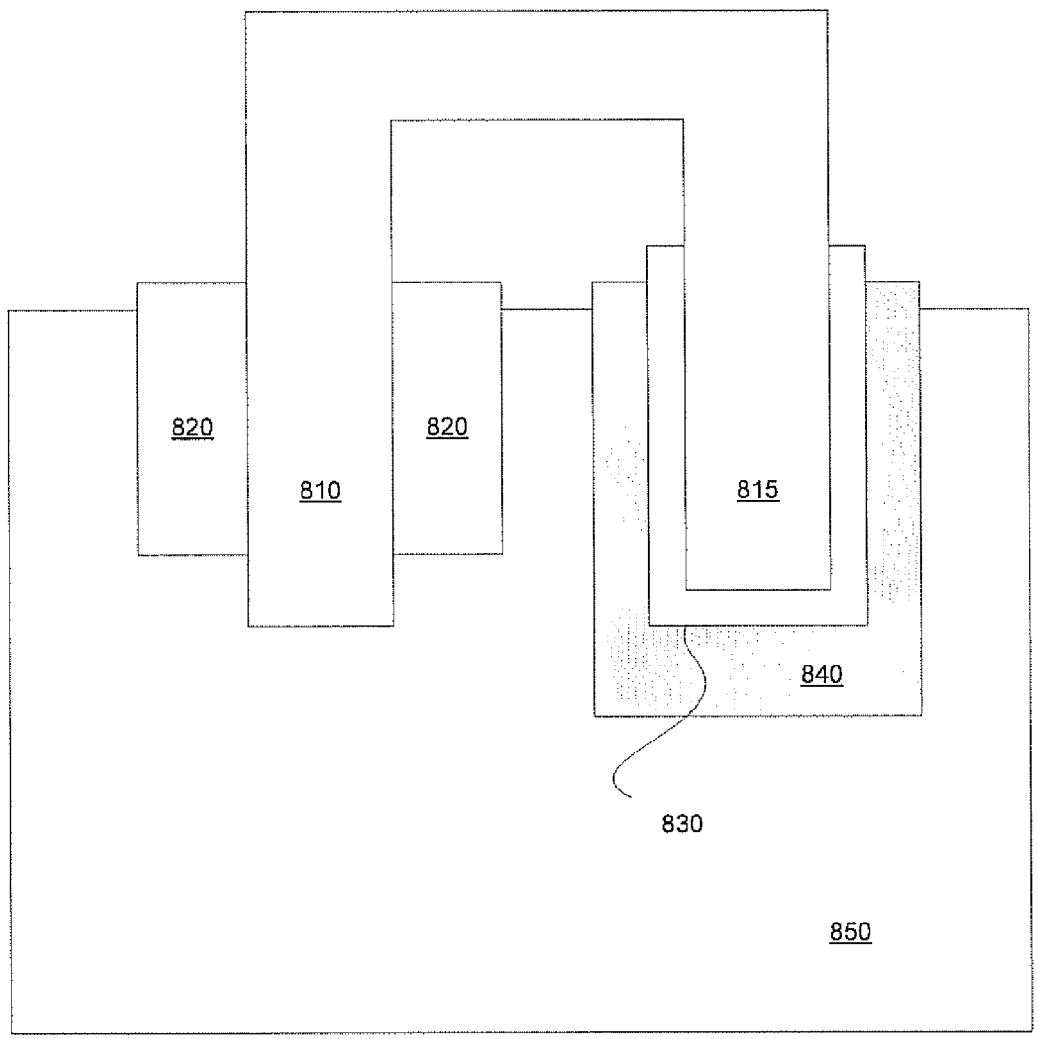
FIG. 8 is a cross-sectional view of a vertically configured floating gate transistor capacitively coupled to a laterally positioned doped region, in accordance with one embodiment of the present disclosure.

FIG. 8 is a cross-sectional view of a vertically configured memory cell 800 including a floating gate memory transistor capacitively coupled to a laterally positioned doped region having n-type or p-type dopants (e.g., n-doped region, such as an actively doped N+ region or n-well), in accordance with one embodiment of the present disclosure. The vertically configured floating gate memory cell may be implemented in the configurations of Array #1 and Array #2 of FIGS. 5A-F and 7A-E respectively. That is, memory cells of both a planar configuration as well as a vertical configuration are implementable within Arrays #1 and #2.

In one embodiment, the floating gate memory cell 800 is configured as a recessed channel array transistor (RCAT), and is partially embedded in the substrate 850. In that manner, memory device 800 is configured as a vertical structure. While FIG. 8 depicts the non-volatile memory in a RCAT configuration, it will be apparent to those skilled in the art that other vertical structures can be used. Thus, embodiments of the present invention can be used in multi-gate (FinFET type) orientations, or in any configuration wherein the floating gate is oriented vertically with respect to the substrate 850.

As shown in FIG. 8, source/drain regions 820 are formed adjacent to the floating gate 810 of the memory transistor. In addition, the floating gate 810 is not electrically connected to a voltage source, but a voltage is applied to the gate 810 through capacitive coupling. More particularly, the floating gate 810 is capacitively coupled to a doped region 840 doped with n-type dopants, at least portions of which are located laterally from the memory transistor. The channel region of the memory transistor is disposed between the source/drain region 820 under and around a bottom portion of the floating gate 810.

The floating gate 810 extends beyond the channel region of the memory transistor in cell 800. For instance, the floating gate 810 includes and/or is electrically coupled to a gate extension 815 that is disposed laterally from the memory transistor including source/drain regions 820 and floating gate 810. More particularly, the gate extension 815 overlaps a buried doped region 840, wherein an oxide layer 830 is disposed between the gate extension 815 and the buried doped region 840. In that manner, the gate contact 815 and by extension the floating gate 810 are capacitively coupled to the doped region 840. As such, a portion of any voltage applied to the doped region 840 is applied through capacitive coupling to the floating gate 810. Thus the buried doped region 840 serves as the control gate for memory cell 800.

Figure 9:
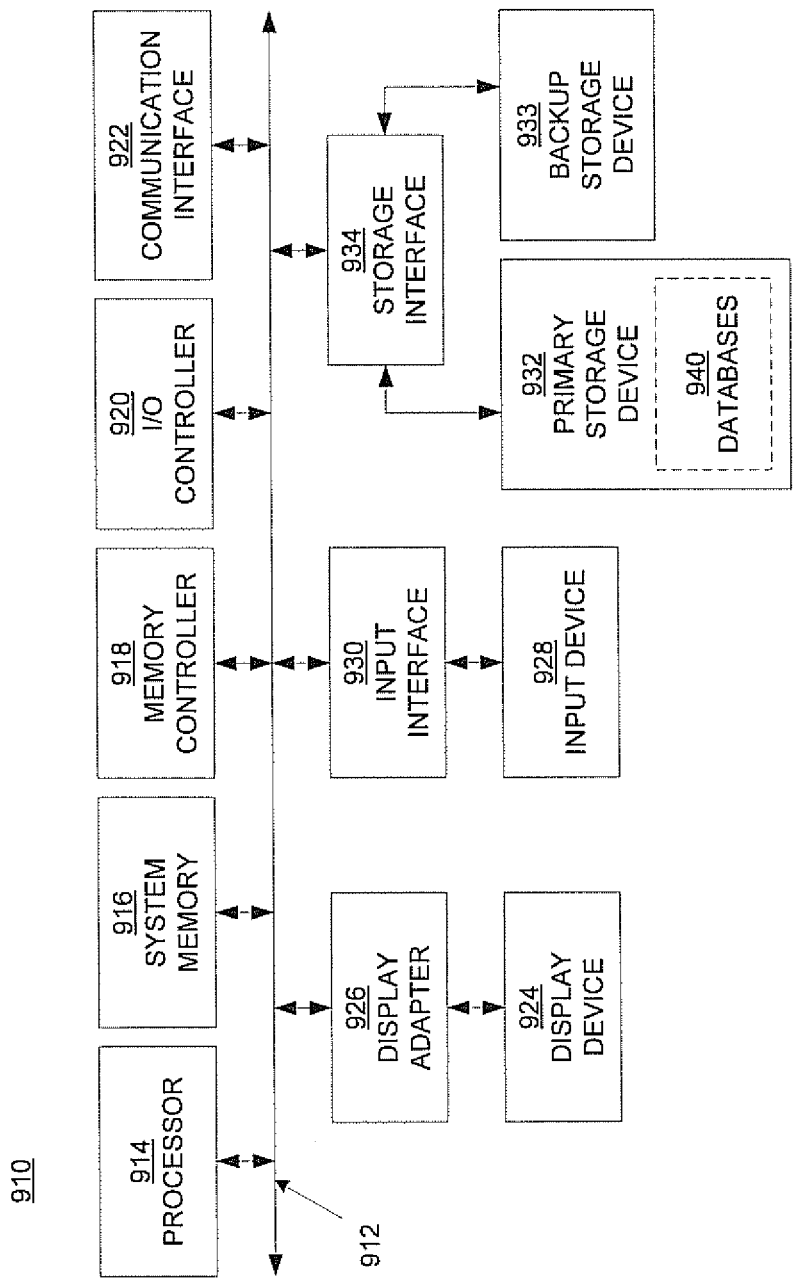
FIG. 9 depicts a block diagram of an exemplary computer system suitable for implementing the present memory systems and methods, in accordance with one embodiment of the invention.

FIG. 9 is a block diagram of an exemplary computing system 910 capable of implementing embodiments of the present disclosure. Computing system 910 broadly represents any single or multi-processor computing device or system capable of executing computer-readable instructions, and including packaged components (e.g., processor 914, memory 916, memory controller 918, etc.). Examples of computing system 910 include, without limitation, workstations, laptops, client-side terminals, servers, distributed computing systems, handheld devices, or any other computing system or device. In its most basic configuration, computing system 910 may include at least one processor 914 and a system memory 916.

Processor 914 generally represents any type or form of processing unit capable of processing data or interpreting and executing instructions. In certain embodiments, processor 914 may receive instructions from a software application or module. These instructions may cause processor 914 to perform the functions of one or more of the example embodiments described and/or illustrated herein. For example, processor 914 may perform and/or be a means for performing, either alone or in combination with other elements, one or more of the identifying, determining, using, implementing, translating, tracking, receiving, moving, and providing described herein. Processor 914 may also perform and/or be a means for performing any other steps, methods, or processes described and/or illustrated herein.

System memory 916 generally represents any type or form of volatile and/or non-volatile storage device or medium capable of storing data and/or computer-readable instructions. Additionally, memory 916 may be representative of a stack of memory chips within one or more packaged devices. Examples of system memory 916 include, without limitation, RAM, DRAM, ROM, flash memory, or any other suitable memory device. Although not required, in certain embodiments computing system 910 may include both a volatile memory unit (such as, for example, system memory 916) and a non-volatile storage device (such as, for example, primary storage device 932). Memory devices in system memory 916 may include one or more of the non-volatile memory devices 100, 300, and 800, as well as the arrays 200, 500, 500A, and 700. In other embodiments, non-volatile memory devices 100, 300, and 800 may be imbedded internal to processor 914 or some other component in system 910 whose primary function is not memory.

Computing system 910 may also include one or more components or elements in addition to processor 914 and system memory 916. For example, in the embodiment of FIG. 9, computing system 910 includes a memory controller 918, an input/output (I/O) controller 920, and a communication interface 922, each of which may be interconnected via a communication infrastructure 912. Communication infrastructure 912 generally represents any type or form of infrastructure capable of facilitating communication between one or more components of a computing device. Examples of communication infrastructure 912 include, without limitation, a communication bus (such as an Industry Standard Architecture (ISA), Peripheral Component Interconnect (PCI), PCI Express (PCIe), or similar bus) or a data network like, for example, Ethernet, Bluetooth, or Wi-Fi.

Memory controller 918 generally represents any type or form of device capable of handling memory or data or controlling communication between one or more components of computing system 910. For example, memory controller 918 may control communication between processor 914, system memory 916, and I/O controller 920 via communication infrastructure 912. Memory controller 918 may perform and/or be a means for performing, either alone or in combination with other elements, one or more of the operations or features described herein.

I/O controller 920 generally represents any type or form of module capable of coordinating and/or controlling the input and output functions of a computing device. For example, I/O controller 920 may control or facilitate transfer of data between one or more elements of computing system 910, such as processor 914, system memory 916, communication interface 922, display adapter 926, input interface 930, and storage interface 934. I/O controller 920 may be used, for example, to perform and/or be a means for performing, either alone or in combination with other elements, one or more of the operations described herein. I/O controller 920 may also be used to perform and/or be a means for performing other operations and features set forth in the instant disclosure.

Communication interface 922 broadly represents any type or form of communication device or adapter capable of facilitating communication between example computing system 910 and one or more additional devices. For example, communication interface 922 may facilitate communication between computing system 910 and a private or public network including additional computing systems. Examples of communication interface 922 include, without limitation, a wired network interface (such as a network interface card), a wireless network interface (such as a wireless network interface card), a modem, and any other suitable interface. In one embodiment, communication interface 922 provides a direct connection to a remote server via a direct link to a network, such as the Internet. Communication interface 922 may also indirectly provide such a connection through, for example, a local area network (such as an Ethernet network), a personal area network, a telephone or cable network, a cellular telephone connection, a satellite data connection, or any other suitable connection.

Communication interface 922 may also represent a host adapter configured to facilitate communication between computing system 910 and one or more additional network or storage devices via an external bus or communications channel. Communication interface 922 may also allow computing system 910 to engage in distributed or remote computing. For example, communication interface 922 may receive instructions from a remote device or send instructions to a remote device for execution. Communication interface 922 may perform and/or be a means for performing, either alone or in combination with other elements, one or more of the operations disclosed herein. Communication interface 922 may also be used to perform and/or be a means for performing other operations and features set forth in the instant disclosure.

As illustrated in FIG. 9, computing system 910 may also include at least one display device 924 coupled to communication infrastructure 912 via a display adapter 926. Display device 924 generally represents any type or form of device capable of visually displaying information forwarded by display adapter 926. Similarly, display adapter 926 generally represents any type or form of device configured to forward graphics, text, and other data from communication infrastructure 912 (or from a frame buffer, as known in the art) for display on display device 924.

As illustrated in FIG. 9, computing system 910 may also include at least one input device 928 coupled to communication infrastructure 912 via an input interface 930. Input device 928 generally represents any type or form of input device capable of providing input, either computer- or human-generated, to computing system 910. Examples of input device 928 include, without limitation, a keyboard, a pointing device, a speech recognition device, or any other input device. In one embodiment, input device 928 may perform and/or be a means for performing, either alone or in combination with other elements, one or more of the operations disclosed herein. Input device 928 may also be used to perform and/or be a means for performing other operations and features set forth in the instant disclosure.

As illustrated in FIG. 9, computing system 910 may also include a primary storage device 932 and a backup storage device 933 coupled to communication infrastructure 912 via a storage interface 934. Storage devices 932 and 933 generally represent any type or form of storage device or medium capable of storing data and/or other computer-readable instructions. For example, storage devices 932 and 933 may be a magnetic disk drive (e.g., a so-called hard drive), a floppy disk drive, a magnetic tape drive, an optical disk drive, a flash drive, or the like. Storage interface 934 generally represents any type or form of interface or device for transferring data between storage devices 932 and 933 and other components of computing system 910.

In one example, databases 940 may be stored in primary storage device 932. Databases 940 may represent portions of a single database or computing device or a plurality of databases or computing devices. For example, databases 940 may represent (be stored on) a portion of computing system 910. Alternatively, databases 940 may represent (be stored on) one or more physically separate devices capable of being accessed by a computing device, such as computing system 910.

Continuing with reference to FIG. 9, storage devices 932 and 933 may be configured to read from and/or write to a removable storage unit configured to store computer software, data, or other computer-readable information. Examples of suitable removable storage units include, without limitation, a floppy disk, a magnetic tape, an optical disk, a flash memory device, or the like. Storage devices 932 and 933 may also include other similar structures or devices for allowing computer software, data, or other computer-readable instructions to be loaded into computing system 910. For example, storage devices 932 and 933 may be configured to read and write software, data, or other computer-readable information. Storage devices 932 and 933 may also be a part of computing system 910 or may be separate devices accessed through other interface systems.

Storage devices 932 and 933 may be used to perform, and/or be a means for performing, either alone or in combination with other elements, one or more of the operations disclosed herein. Storage devices 932 and 933 may also be used to perform, and/or be a means for performing, other operations and features set forth in the instant disclosure.

Many other devices or subsystems may be connected to computing system 910. Conversely, all of the components and devices illustrated in FIG. 9 need not be present to practice the embodiments described herein. The devices and subsystems referenced above may also be interconnected in different ways from that shown in FIG. 9. Computing system 910 may also employ any number of software, firmware, and/or hardware configurations. For example, the example embodiments disclosed herein may be encoded as a computer program (also referred to as computer software, software applications, computer-readable instructions, or computer control logic) on a computer-readable medium.

The computer-readable medium containing the computer program may be loaded into computing system 910. All or a portion of the computer program stored on the computer-readable medium may then be stored in system memory 916 and/or various portions of storage devices 932 and 933. When executed by processor 914, a computer program loaded into computing system 910 may cause processor 914 to perform and/or be a means for performing the functions of the example embodiments described and/or illustrated herein. Additionally or alternatively, the example embodiments described and/or illustrated herein may be implemented in firmware and/or hardware. For example, computing system 910 may be configured as an application specific integrated circuit (ASIC) adapted to implement one or more of the embodiments disclosed herein.

Thus, according to embodiments of the present invention, non-volatile floating gate memory devices that are programmable through separate conductors for the source and drain nodes of a non-volatile memory cell, as well as the n-well contact capacitively coupled to a floating gate are described.

While the foregoing disclosure sets forth various embodiments using specific block diagrams, flow charts, and examples, each block diagram component, flow chart step, operation, and/or component described and/or illustrated herein may be implemented, individually and/or collectively. In addition, any disclosure of components contained within other components should be considered as examples because many other architectures can be implemented using the inventive principles described herein.

The process parameters and sequence of steps described and/or illustrated herein are given by way of example only and can be varied as desired. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

Embodiments according to the invention are thus described. While the present disclosure has been described in particular embodiments, it should be appreciated that the invention should not be construed as limited by such embodiments, but rather construed according to the below claims.

The invention claimed is:

1. A memory array, comprising:
   a plurality of memory cells arranged in an array of rows and columns, wherein each memory cell comprises:
     a floating gate memory transistor including a floating gate, a source region and a drain region; and
     a coupling capacitor located laterally from said floating gate memory transistor and having a first terminal electrically coupled to said floating gate and a second terminal operational as a control gate;
   a plurality of first bit lines oriented in a first direction, wherein each first bit line is coupled to drain regions of floating gate memory transistors that are arranged in a corresponding column;
   a plurality of second bit lines oriented in said first direction, wherein each second bit line is coupled to source regions of floating gate memory transistors that are arranged in a corresponding column; and
   a plurality of word lines oriented in a second direction that is orthogonal to said first direction, wherein each word line is coupled to the second terminals of said coupling capacitors that are arranged in a corresponding row through one or more doped diffusion regions.

2. The memory array of claim 1, wherein said floating gate memory transistors in said plurality of memory cells are programmed through source side injection.

3. The memory array of claim 1, wherein at least one of said plurality of second bit lines comprises:
   a shared bit line, such that source regions of floating gate memory transistors included in two adjacent columns are coupled to said shared bit line.

4. The memory array of claim 1, wherein said floating gate memory transistor comprises non-symmetric source and drain junctions, including a graded source junction between said source region and a channel between said source and drain regions, wherein said graded source junction includes a lightly doped region.

5. The memory array of claim 1, wherein said floating gate memory transistor comprises symmetric source and drain junctions.

6. A method for operating a memory array, comprising:
   providing a plurality of memory cells arranged in an array of rows and columns, wherein each memory cell comprises:
     a floating gate memory transistor including a floating gate, a source region and a drain region; and
     a coupling capacitor located laterally from said floating gate memory transistor and having a first terminal electrically coupled to said floating gate and a second terminal operational as a control gate;
   providing a plurality of first bit lines oriented in a first direction, wherein each first bit line is coupled to drain regions of floating gate memory transistors that are arranged in a corresponding column;
   providing a plurality of second bit lines oriented in said first direction, wherein each second bit line is coupled to source regions of floating gate memory transistors that are arranged in a corresponding column;

providing a plurality of word lines oriented in a second direction that is orthogonal to said first direction, wherein each word line is coupled to the second terminals of said coupling capacitors that are arranged in a corresponding row through one or more doped diffusion regions; and applying various combinations of voltages to one or more first bit lines, one or more second bit lines, and one or more word lines to program, erase, and read one or more floating gate memory transistors in said plurality of memory cells.

7. The method of claim 6, further comprising:
performing a program operation on a floating gate memory transistor associated with a word line a first bit line and a second bit line, wherein said performing a program operation comprises:
applying a first voltage (VWLprogram) to said word line;
applying a second voltage (VDLprogram) to said first bit line; and
applying a ground voltage to said second bit line.

8. The method of claim 6, further comprising:
performing an erase operation on a row of floating gate memory transistors associated with a corresponding word line through hot hole injection, wherein said performing an erase operation comprises:
applying a ground voltage to said corresponding word line;
applying a first voltage (Ve) to said plurality of first bit lines; and
leave floating or applying a second voltage (½ Ve) approximately one-half of said first voltage to said plurality of second bit lines.

9. The method of claim 8, wherein said performing an erase operation further comprises:
applying a masking voltage to remaining word lines in said plurality of word lines.

10. The method of claim 8, wherein said performing an erase operation further comprises:
erasing a block of floating gate memory transistors by applying said ground voltage to word lines in said plurality of word lines associated with said block.

11. The method of claim 6, further comprising:
performing an erase operation on a column of floating gate memory transistors through hot hole injection, wherein said column is associated with a first bit line and a second bit line, wherein said performing an erase operation comprises:
applying a first voltage (Ve) to said first bit line;
letting float or applying a second voltage (½ Ve) approximately one-half of said first voltage to said second bit line; and
applying a ground voltage to said plurality of word lines.

12. The method of claim 11, wherein said performing an erase operation further comprises:
applying a ground voltage to the remaining first bit lines in said plurality of first bit lines.

13. The method of claim 6, further comprising:
performing an erase operation on a floating gate memory transistor associated with a word line, a first bit line and a second bit line, wherein said performing an erase operation comprises:
applying a ground voltage to said word line;
applying a first voltage (Ve) to said first bit line; and
letting float or applying a second voltage (½ Ve) approximately one-half of said first voltage to said second bit line.

14. The method of claim 13, wherein said performing an erase operation further comprises;
applying a masking voltage to the remaining word lines in said plurality of word lines; and
applying said ground voltage to the remaining second bit lines.

15. The method of claim 6, further comprising:
performing a read operation on a floating gate memory transistor associated with a word line, a first bit line and a second bit line, wherein said performing comprises:
applying a first voltage (VWLread) to said word line;
applying a second voltage (VDLread) to said first bit line; and
applying a ground voltage to said plurality of second bit lines.

16. The method of claim 15, wherein said performing a read operation further comprises;
applying a ground voltage to remaining word lines in said plurality of word lines; and
applying said ground voltage to remaining first bit lines in said plurality of first bit lines.

17. A flash memory array, comprising:
a plurality of memory cells arranged in an array of rows and columns, wherein each memory cell comprises:
a floating gate memory transistor including a floating gate, a source region and a drain region; and
a coupling capacitor electrically coupled to said floating gate and located laterally from said floating gate memory transistor, said coupling capacitor comprising a control gate;
a plurality of first bit lines oriented in a first direction, wherein each first bit line is coupled to drain regions of floating gate memory transistors that are arranged in a corresponding row;
a plurality of second bit lines oriented in a second direction that is orthogonal to said first direction, wherein each second bit line is coupled to source regions of floating gate memory transistors that are arranged in a corresponding column; and
a plurality of word lines oriented in said first direction, wherein each word line is coupled to control gates of said coupling capacitors that are arranged in a corresponding row through one or more doped diffusion regions.

18. The memory array of claim 17, wherein said floating gate memory transistors in said plurality of memory cells are configured for source side injection during programming.

19. The memory array of claim 17, wherein said floating gate memory transistor comprises non-symmetric source and drain junctions, including a graded source junction between said source region and a channel between said source and drain regions, wherein said graded source junction includes a lightly doped region.

20. The memory array of claim 17, wherein said floating gate memory transistor comprises symmetric source and drain junctions.

21. A method for operating a memory array, comprising:
providing a plurality of memory cells arranged in an array of rows and columns, wherein each memory cell comprises:
a floating gate memory transistor including a floating gate, a source region and a drain region; and a coupling capacitor electrically coupled to said floating gate and located laterally from said floating gate memory transistor, said coupling capacitor comprising a control gate;

providing a plurality of first bit lines oriented in a first direction, wherein each first bit line is coupled to drain regions of floating gate memory transistors that are arranged in a corresponding row;

providing a plurality of second bit lines oriented in a second direction that is orthogonal to said first direction, wherein each second bit line is coupled to source regions of floating gate memory transistors that are arranged in a corresponding column; and providing a plurality of word lines oriented in said first direction, wherein each word line is coupled to control gates of coupling capacitors that are arranged in a corresponding row through one or more doped diffusion regions; and applying various combinations of voltages to one or more first bit lines, one or more second bit lines, and one or more word lines to program, erase, and read one or more floating gate memory transistors in said plurality of memory cells.

22. The method of claim 21, further comprising:
performing a program operation on a floating gate memory transistor associated with a word line, a first bit line, and a second bit line through hot electron injection, wherein said performing a program operation comprises:
applying a first voltage (VDLprogram) to said first bit line;
applying a ground voltage to said second bit line;
applying a masking voltage to remaining second bit lines in said plurality of second bit lines; and
applying a third voltage (VWLprogram) to said word line.

23. The method of claim 22, wherein said performing a program operation further comprises:
applying said ground voltage to the remaining first bit lines in said plurality of first bit lines; and
applying said ground voltage to the remaining word lines in said plurality of word lines.

24. The method of claim 21, further comprising:
performing a program operation on a row of floating gate memory transistors associated with a word line and a second bit line through hot electron injection, wherein said performing a program operation comprises:
applying a first voltage (VDLprgram) to said first bit line;
applying a ground voltage to said plurality of second bit lines; and
applying a second voltage (VWLprogram) to said word line.

25. The method of claim 24, wherein said performing a program operation further comprises:
applying said ground voltage to the remaining first bit lines in said plurality of first bit lines; and
applying said ground voltage to the remaining word lines in said plurality of word lines.

26. The method of claim 21, further comprising:
performing an erase operation on a row of floating gate memory transistors associated with a word line and a first bit line through hot hole injection, wherein said performing an erase operation comprises:
applying a first voltage (VDLerase) to said first bit line;
applying one of (a) a ground voltage to, or (b) a masking voltage to, or (c) leave floating said plurality of second bit lines; and
applying said ground voltage to said plurality of word lines.

27. The method of claim 26, wherein said performing an erase operation further comprises:
applying said ground voltage to the remaining first bit lines in said plurality of first bit lines.

28. The method of claim 21, further comprising:
performing an erase operation on a column of floating gate memory transistors through hot hole injection, wherein said column is associated with a second bit line, wherein said performing an erase operation comprises:
applying a ground voltage to or leaving floating said plurality of first bit lines;
applying a first voltage (VSLerase) to said second bit line; and
applying a ground voltage to said plurality of word lines.

29. The method of claim 28, wherein said performing an erase operation further comprises:
applying a ground voltage to the remaining second bit lines in said plurality of second bit lines.

30. The method of claim 21, further comprising:
performing a read operation on a floating gate memory transistor associated with a word line, a first bit line, and a second bit line, wherein said performing a read operation comprises:
applying a first voltage (VDLread) to said first bit line;
applying a ground voltage to said second bit line; and
applying a second voltage (VWLread) to said word line.

31. The method of claim 30, wherein said performing a read operation further comprises:
applying said ground voltage to the remaining first bit lines in said plurality of first bit lines;
applying a masking voltage to the remaining second bit lines in said plurality of second bit lines; and
applying said ground voltage to the remaining word lines in said plurality of word lines.

* * * * *